United States Patent
Arghavani et al.

(10) Patent No.: US 9,396,961 B2
(45) Date of Patent: Jul. 19, 2016

(54) INTEGRATED ETCH/CLEAN FOR DIELECTRIC ETCH APPLICATIONS

(71) Applicant: Lam Research Corporation, Fremont, CA (US)

(72) Inventors: Reza Arghavani, Scotts Valley, CA (US); Shashank C. Deshmukh, San Ramon, CA (US); Eric A. Hudson, Berkeley, CA (US); Tom Kamp, San Jose, CA (US); Samantha Tan, Fremont, CA (US); Gerardo Adrian Delgadino, Milpitas, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/612,095

(22) Filed: Feb. 2, 2015

(65) Prior Publication Data

US 2016/0181117 A1    Jun. 23, 2016

Related U.S. Application Data

(60) Provisional application No. 62/095,444, filed on Dec. 22, 2014.

(51) Int. Cl.
| | |
|---|---|
| *H01L 21/311* | (2006.01) |
| *H01L 21/67* | (2006.01) |
| *H01L 21/263* | (2006.01) |
| *H01J 37/32* | (2006.01) |

(52) U.S. Cl.
CPC ..... *H01L 21/31116* (2013.01); *H01J 37/32091* (2013.01); *H01L 21/2633* (2013.01); *H01L 21/67069* (2013.01); *H01L 21/67213* (2013.01)

(58) Field of Classification Search
None
See application file for complete search history.

(56) References Cited

U.S. PATENT DOCUMENTS

| | | | | |
|---|---|---|---|---|
| 5,306,671 | A * | 4/1994 | Ogawa | H01L 21/02046 257/E21.193 |
| 5,670,426 | A * | 9/1997 | Kuo | H01L 21/28512 257/E21.162 |
| 5,948,704 | A | 9/1999 | Benjamin et al. | |
| 6,204,193 | B1 * | 3/2001 | Jozaki | H01L 21/31116 257/E21.252 |
| 6,227,211 | B1 * | 5/2001 | Yang | H01L 21/31116 134/1.1 |
| 6,326,307 | B1 * | 12/2001 | Lindley | H01L 21/31116 257/E21.252 |
| 6,638,855 | B1 * | 10/2003 | Chang | H01L 21/02063 257/E21.226 |

(Continued)

OTHER PUBLICATIONS

Agarwal, A. et al "Plasma atomic layer etching using conventional plasma equipment" JVST A 27 (1) 37-50, Dec. 8, 2008.*

(Continued)

*Primary Examiner* — Anita Alanko
(74) *Attorney, Agent, or Firm* — Weaver Austin Villeneuve & Sampson LLP

(57) ABSTRACT

The embodiments herein relate to methods and apparatus for etching a recessed feature in dielectric material. In various embodiments, a recessed feature is formed in two etching operations. The first etching operation partially etches the features and may take place in a reactor configured to produce a capacitively coupled plasma. The first etching operation may end before the underlying semiconductor material experiences substantial damage due to penetration of ions through the dielectric atop the semiconductor material. The second etching operation may take place in a reactor configured to produce an inductively coupled plasma. Both the first and second etching operations may themselves be multi-step, cyclic processes.

26 Claims, 11 Drawing Sheets

(56) References Cited

U.S. PATENT DOCUMENTS

| | | | |
|---|---|---|---|
| 6,756,315 B1* | 6/2004 | Bamnolker | H01L 21/02063 257/E21.577 |
| 7,732,728 B2 | 6/2010 | Dhindsa et al. | |
| 7,740,736 B2 | 6/2010 | Fischer et al. | |
| 2002/0142610 A1* | 10/2002 | Chien | H01L 21/31116 438/710 |
| 2003/0000913 A1* | 1/2003 | Hung | H01L 21/31116 216/2 |
| 2003/0162395 A1* | 8/2003 | Trapp | H01L 21/31144 438/689 |
| 2003/0228768 A1* | 12/2003 | Chae | H01L 21/31144 438/710 |
| 2005/0236365 A1* | 10/2005 | Komatani | H01L 21/30621 216/67 |
| 2014/0011332 A1* | 1/2014 | Meng | H01L 29/66545 438/197 |

OTHER PUBLICATIONS

Athavale, Satish D., et al., "Molecular Dynamics Simulation of Atomic Layer Etching of Silicon," *J. Vac. Sic. Technol.* A 13(3), May/Jun. 1995, pp. 966-971.

Metzler, Dominik, et al. "Fluorocarbon Assisted Atomic Layer Etching of $SiO_2$ Using Cyclic $Ar/C_4F_8$ Plasma," *J. Vac. Sci. Technol*, A 32(2), Mar./Apr. 2014, 5 pp.

Economou, Demetre, "Pulsed Plasma Etching for Semiconductor Manufacturing," *J. Phys. D: Appl Phys.*, 47 (2014) 303001, 27 pp.

Kanarik, Keren J., "Moving atomic Layer Etch From Lab to Fab," *Solid State Technology*, Dec. 2013, pp. 14-17.

U.S. Appl. No. 13/937,930, titled "Fluorocarbon Based Aspect-Ratio Independent Etching," filed Jul. 9, 2013.

U.S. Appl. No. 14/446,203, titled "Methods and Apparatuses for Atomic Layer Cleaning of Contacts and Vias," filed Jul. 29, 2014.

U.S. Appl. No. 13/862,048, titled "CVD Based Metal/Semiconductor OHMIC Contact for High Volume Manufacturing Applications" filed Apr. 12, 2013.

U.S. Appl. No. 14/464,475, titled "Method to Tune TiOx Stoichiometry Using Atomic Layer Deposited Ti Film to Minimize Contact Resistance for TiOx/Ti Based Mis Contact Scheme for CMOS." filed Aug. 20, 2014.

U.S. Appl. No. 14/184,491, titled "Internal Plasma Grid Applications for Semiconductor Fabrication," filed Feb. 19, 2014.

* cited by examiner

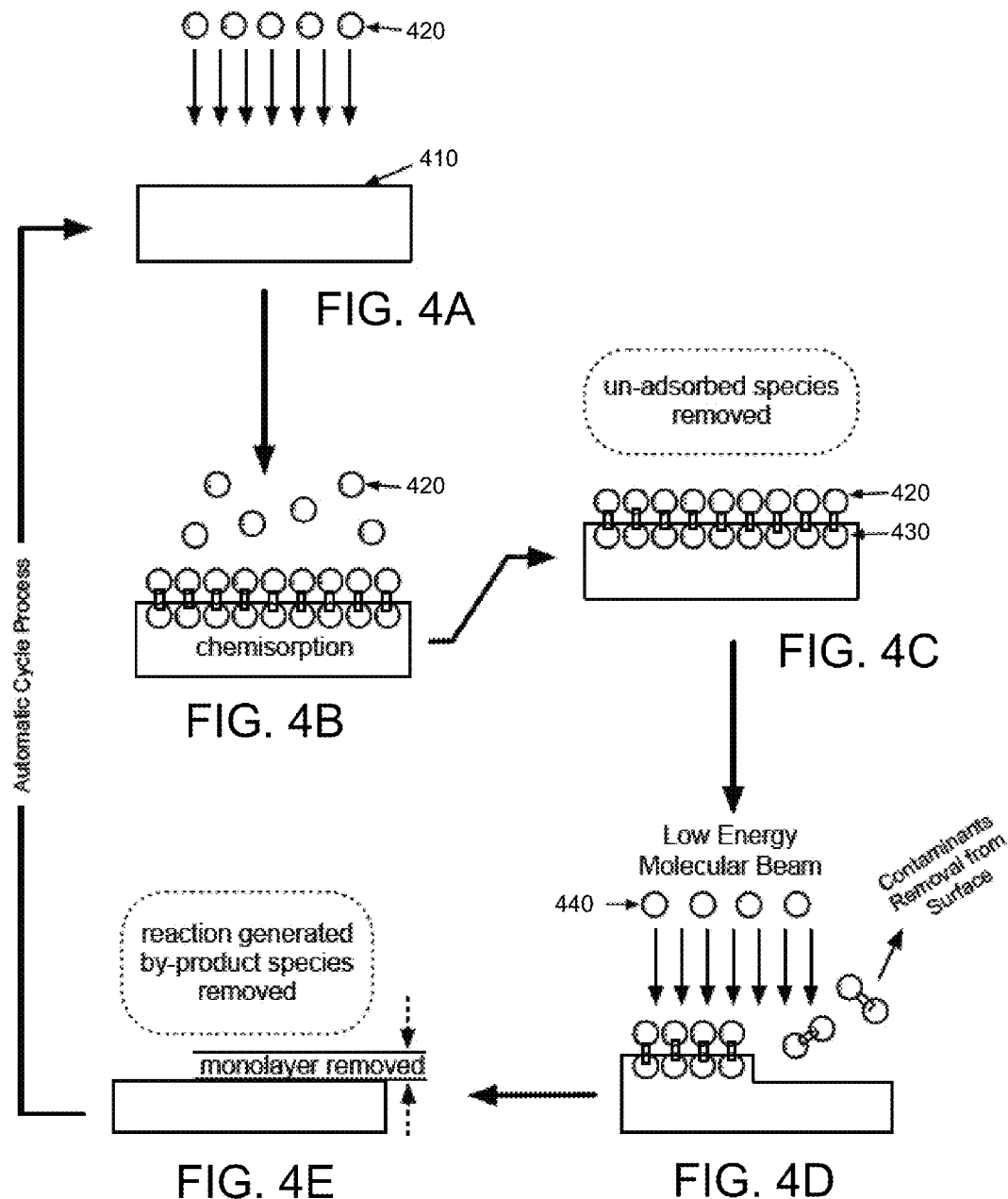

INTEGRATED ETCH/CLEAN FOR DIELECTRIC ETCH APPLICATIONS

CROSS-REFERENCE TO RELATED APPLICATION

This application claims the benefit of priority to U.S. Provisional Patent Application No. 62/095,444, filed Dec. 22, 2014, and titled "INTEGRATED ETCH/CLEAN FOR DIELECTRIC ETCH APPLICATIONS," which is herein incorporated by reference in its entirety and for all purposes.

BACKGROUND

Fabrication of various semiconductor devices involves performing a contact etch in which dielectric material is etched to form a recess in which an electrical contact is later formed. As device dimensions continue to shrink, this contact etch is increasingly difficult to perform with sufficient selectivity and with an acceptably low degree of damage to the device.

SUMMARY

Certain embodiments herein relate to methods and apparatus for etching a recessed feature in dielectric material. Often, the dielectric material is positioned above semiconductor material that is sensitive to damage from ions. The recessed feature may be formed using two basic etching operations, the first being performed with a capacitively coupled plasma and the second being performed with an inductively coupled plasma. The first etching operation is typically stopped before ions from the capacitively coupled plasma can substantially penetrate through the remaining dielectric material to damage the underlying semiconductor material. The second etching operation finishes etching the recessed feature under more gentle conditions that are less likely to damage the underlying substrate material. In this way, damage to the underlying semiconductor material is avoided and there is no need to remove or repair damaged semiconductor material.

In one aspect of the embodiments herein, a method is provided for etching a recessed feature in a semiconductor substrate, the method including: providing a substrate including dielectric material over semiconductor material to a first reaction chamber, where the recessed feature is to be formed in the dielectric material; performing a first etching operation in the first reaction chamber to etch the recessed feature in the dielectric material to a first depth, the first etching operation including exposing the substrate to a first plasma including a first set of ions with a mean free path in the dielectric material, the first plasma being a capacitively coupled plasma, where after the first etching operation, remaining dielectric material below the first etch depth and above the semiconductor material has a thickness that is at least about the mean free path of the first set of ions in the dielectric material; transferring the substrate from the first reaction chamber to a second reaction chamber; after transferring the substrate, performing a second etching operation in the second reaction chamber to etch the recessed feature to a final depth, where the second etching operation is an atomic layer etching operation that includes exposing the substrate to a second plasma, the second plasma being an inductively coupled plasma.

In some embodiments the second etching operation includes: exposing the substrate to an etching reactant and allowing the etching reactant to adsorb onto the substrate surface, removing non-adsorbed etching reactant from the second reaction chamber, exposing the substrate to the second plasma to drive a reaction between a species in the adsorbed reactant and dielectric material in the recessed feature to thereby remove a portion of the dielectric material, and repeating the steps of exposing the substrate to an etching reactant, removing the non-adsorbed etching reactant, and exposing the substrate to the second plasma until the recessed feature reaches the final depth. The etching reactant may include a fluorocarbon. In various cases, when the recessed feature reaches the final etch depth, the semiconductor material is exposed.

The first etching operation in some cases includes: exposing the substrate to a fluorocarbon plasma to deposit a layer of fluorocarbon polymer on the substrate, and exposing the substrate to the first plasma to etch the fluorocarbon polymer and dielectric. In certain embodiments, exposing the substrate to the first plasma includes performing a fluorocarbon polymer sputtering stage and performing an activated etch stage. Exposing the substrate to the first plasma may further include performing a pure sputtering stage after the fluorocarbon polymer is substantially removed in the activated etch stage. In certain embodiments, during the fluorocarbon polymer sputtering stage and the activated etch stage, a total RF power used to generate the first plasma is between about 900 W or less, a pressure in the first reaction chamber is between about 10-40 mTorr, and the substrate is maintained between about 60-100° C. The first plasma may be generated from an inert gas flowed at a rate between about 2-2000 sccm during the fluorocarbon polymer sputtering stage, and at a rate between about 40-1000 sccm during the activated etch stage. In some embodiments, gas used to generate the fluorocarbon plasma includes fluorocarbon and inert gas, and gas used to generate the first plasma includes inert gas. For example in certain cases, the gas used to generate the first plasma substantially does not include non-inert species.

The first etching operation typically stops when remaining dielectric material below the first etch depth and above the semiconductor material is at least as thick as the mean free path of the first set of ions in the dielectric material. In some cases the mean free path of the first set of ions in the dielectric material is between about 1-10 nm. In some cases the mean free path of the first set of ions in the dielectric material is between about 2-5 nm.

In various embodiments the dielectric material is a silicon oxide. The recessed feature may be a contact hole into which a contact is later formed. In certain cases, the recessed feature is a contact hole for a FinFET. The etched feature may have particular dimensions. In some cases, for instance, the recessed feature has a width between about 7-30 nm when the recessed feature has reached the final depth. The final depth may be between about 40-150 nm in some cases. Further, when the recessed feature is at the final depth, it may have a height:width aspect ratio between about 4:1 and 12:1.

In a particular embodiment, the first set of ions has a maximum penetration depth in the dielectric material, and after the first etching operation, the thickness of the remaining dielectric material below the first etch depth and above the semiconductor material is at least about the maximum penetration depth of the first set of ions in the dielectric material.

In another aspect of the disclosed embodiments, an apparatus for etching a recessed feature in dielectric material on a semiconductor substrate is provided, the apparatus including: a first reaction chamber including a first plasma generator for generating a capacitively coupled plasma; a second reaction chamber including a second plasma generator for generating an inductively coupled plasma, where the first and second reaction chambers are provided together in a cluster tool; and one or more controllers for controlling processes within the first and second reaction chambers, the one or more controllers including instructions for: performing a first etching operation in the first reaction chamber to etch the recessed feature in the dielectric material to a first depth, the first etching operation including: exposing the substrate to a first plasma including a first set of ions with a mean free path in the dielectric material, and ceasing the first etching operation before the dielectric material remaining below the first etch depth and above the semiconductor material reaches a thickness that would be less than the mean free path of the first set of ions in the dielectric material; transferring the substrate from the first reaction chamber to the second reaction chamber; and performing a second etching operation in the second reaction chamber to etch the recessed feature in the dielectric material to a final depth, the second etching operation being an atomic layer etching process including: exposing the substrate to a second plasma, the second plasma being an inductively coupled plasma.

In some embodiments, the instructions for performing the second etching operation further include instructions for: exposing the substrate to an etching reactant and allowing the etching reactant to adsorb onto the substrate surface, removing non-adsorbed etching reactant from the second reaction chamber, exposing the substrate to the second plasma to drive a reaction between a species in the adsorbed reactant and dielectric material in the recessed feature to thereby remove a portion of the dielectric material, and repeating the steps of exposing the substrate to an etching reactant, removing the non-adsorbed etching reactant, and exposing the substrate to the second plasma until the recessed feature reaches the final depth.

The instructions for performing the first etching operation may in various cases include instructions for: exposing the substrate to a fluorocarbon plasma to deposit a layer of fluorocarbon polymer on the substrate, and exposing the substrate to the first plasma to etch the fluorocarbon polymer and dielectric. The instructions for exposing the substrate to the first plasma may include instructions for performing a fluorocarbon polymer sputtering stage and an activated etch stage. The instructions for exposing the substrate to the first plasma may further include instructions for performing a pure sputtering stage after the fluorocarbon polymer is substantially removed in the activated etch stage.

In some implementations, the instructions for performing the fluorocarbon polymer sputtering stage include instructions to: flow inert gas at a rate between about 20-2000 sccm to generate the first plasma, supply a total RF power of about 900 W or less to generate the first plasma, maintain a pressure between about 10-40 mTorr in the first reaction chamber, and maintain the substrate at a temperature between about 60-110° C., and the instructions for performing the activated etch stage include instructions to: flow inert gas at a rate between about 40-1000 sccm to generate the first plasma, supply a total RF power of about 900 W or less to generate the first plasma, maintain a pressure between about 10-40 mTorr in the first reaction chamber, and maintain the substrate at a temperature between about 60-110° C. In some cases, the instructions for performing the first etching operation include instructions to stop the first etching operation when the first etch depth is between about 40-150 nm.

These and other features will be described below with reference to the associated drawings.

BRIEF DESCRIPTION OF THE DRAWINGS

FIGS. 4A-4E show simplified views of a partially fabricated semiconductor device during a second etching operation as disclosed herein.

DETAILED DESCRIPTION

Figure 1A:
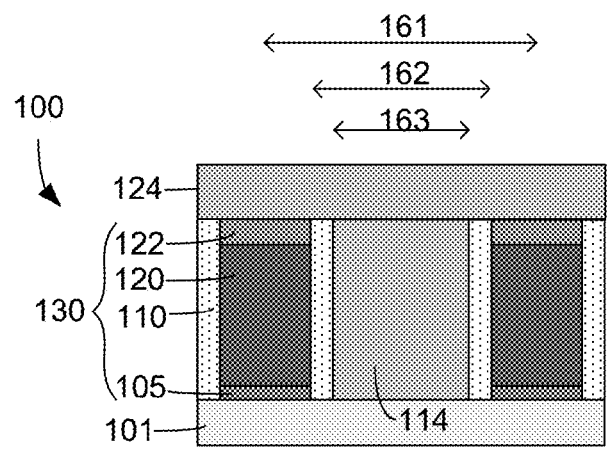
FIGS. 1A-1C depict a partially fabricated semiconductor device at various stages during an etching process as described herein.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards, magnetic recording media, magnetic recording sensors, mirrors, optical elements, micro-mechanical devices and the like.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Context and Process Flow

One important process for fabricating semiconductor devices involves forming electrical connections between vertically separated regions. A contact etch can be performed to etch a recessed feature (also referred to as a contact hole) into dielectric material, often silicon oxide ($SiO_2$). This contact hole can then be filled with conductive material to electrically connect the vertically separated regions. Certain embodiments herein relate to methods and apparatus for etching a contact hole. In some other embodiments, the methods and apparatus described herein can be used to etch vias, trenches, or other recessed features.

Certain conventional processes for etching the contact hole involve reaction chambers equipped with capacitively coupled plasma generators. During the contact etch, fluorocarbon plasma is used to selectively etch silicon dioxide. Ideally, silicon oxide is removed while silicon (or silicon germanium) and silicon nitride (e.g., $Si_3N_4$) are etched only minimally or not at all. Scavenger gases such as hydrogen and/or fluorine-deficient fluorocarbons (e.g., $C_4F_8$) may be used to adjust the etch rates of the various materials. These scavenger gases may also affect the rate of formation of a fluorocarbon polymer that may be formed during the etch.

Also in certain contact etch conventional processes, advanced mixed mode pulsing (AMMP) is used to allow for pulsing of both RF and gas delivery. Thus, a cyclic multi-step etching process may take place, including the basic steps of deposition and activation. More specifically, the steps may include: (a) fluorocarbon polymer deposition, (b) fluorocarbon polymer sputtering/thinning, (c) activated etching, and (d) pure sputtering. Steps (b)-(d) may occur in the activation step. This multi-step process results in a high degree of selectivity for the relevant materials (e.g., $SiO_2$, Si, $Si_3N_4$). Details related to dielectric etching processes are further discussed and described in U.S. patent application Ser. No. 13/937,930, filed Jul. 9, 2013, and titled "FLUOROCARBON BASED ASPECT-RATIO INDEPENDENT ETCHING," and in "Fluorocarbon assisted atomic layer etching of SiO2 using cyclic Ar/C4F8 plasma" by Metzler, et al., Journal of Vacuum Science & Technology A, 32, 020603 (2014), which are herein incorporated by reference in their entireties.

While the multi-step capacitively coupled process mentioned above results in very good selectivity during etching, the process results in a certain degree of damage to underlying layers due to the high ion energies used. For instance, a semiconductor material lattice (e.g., silicon or other substrate semiconductor material) positioned below a dielectric material being etched can become damaged due to excessive ion bombardment. During etching, some ions penetrate through the dielectric material and into the underlying semiconductor material. These ions cause significant damage and lead to substantial device degradation. Typically, the damaged semiconductor material is oxidized and removed through a separate processing step (e.g., a wet cleaning step). This problem is especially significant in 10-20 nm technology nodes and beyond, since relatively high ion energies are used to etch the narrow features at high aspect ratios. Lower ion energies may result in less damage to the underlying substrate, but are often infeasible due to the long processing times involved, which result in the feature opening up to wider-than-desired dimensions.

Another type of reaction chamber that may be used for certain semiconductor fabrication processes is a reaction chamber equipped with a plasma generator for forming an inductively coupled plasma (also referred to as a transformer coupled capacitively tuned plasma). In an inductively coupled plasma reactor, a transformer coupled capacitive tuning (TCCT) parameter may be varied to specify the portion of power applied to the center of a coil vs. the portion of power applied to an outer segment of the coil. At higher TCCT settings, more power is directed toward the center segment of the TCP coil. This type of plasma/reaction chamber is beneficial in promoting a high degree of plasma uniformity, and is often used to etch conductive materials. Certain techniques such as bias pulsing can lead to superior micro loading. The plasma uniformity, micro loading, and other factors allow for precise removal of small amounts of material (e.g., a single layer of material in each cycle), even from the bottom of trenches in many cases. By pulsing the RF and gas delivery though AMMP, atomic layer clean and atomic layer etch processes are enabled.

In various embodiments herein, an initial portion of an etch process is performed using a capacitively coupled plasma, and a final portion of the etch process is performed using an inductively coupled plasma. Each portion of the etch process may take place in a different reaction chamber. The two reaction chambers may be positioned on a single cluster tool. The cluster tool may include load locks or other mechanisms for transferring the substrate from one reaction chamber to the next while protecting the substrate (e.g., while maintaining vacuum on the substrate).

The first portion of the etch utilizes a capacitively coupled plasma to selectively etch a trench in the dielectric material. One example of a reaction chamber that may be configured to perform the first part of this etch process is the 2300® Flex™ Product Family available from Lam Research Corporation of Fremont, Calif. This first portion of the etch may occur according to the conventional multi-step etch process mentioned above and discussed in greater detail below. However, the first portion of the etch is stopped before the etch is complete (i.e., before reaching the underlying semiconductor material). The first portion of the etch is stopped early to prevent ions from penetrating through the remaining dielectric material and damaging the underlying semiconductor material.

Figure 1B:
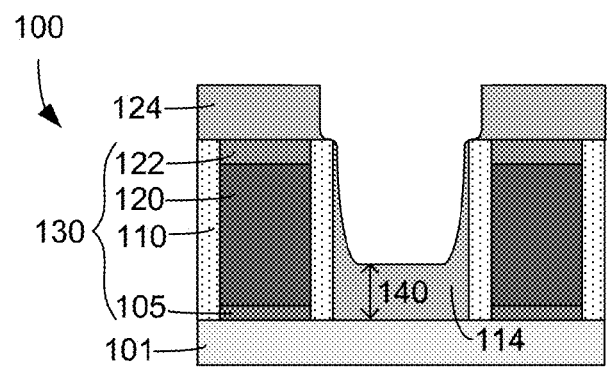
Figure 1C:
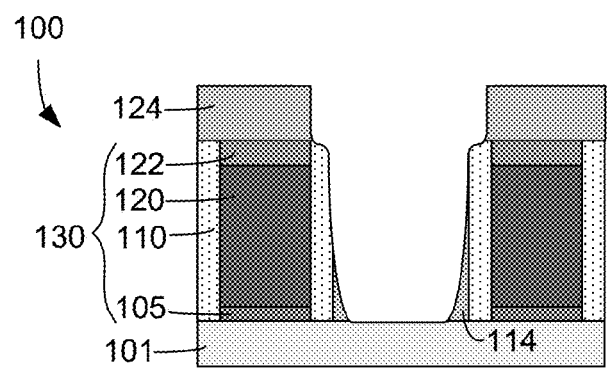
Figure 2:
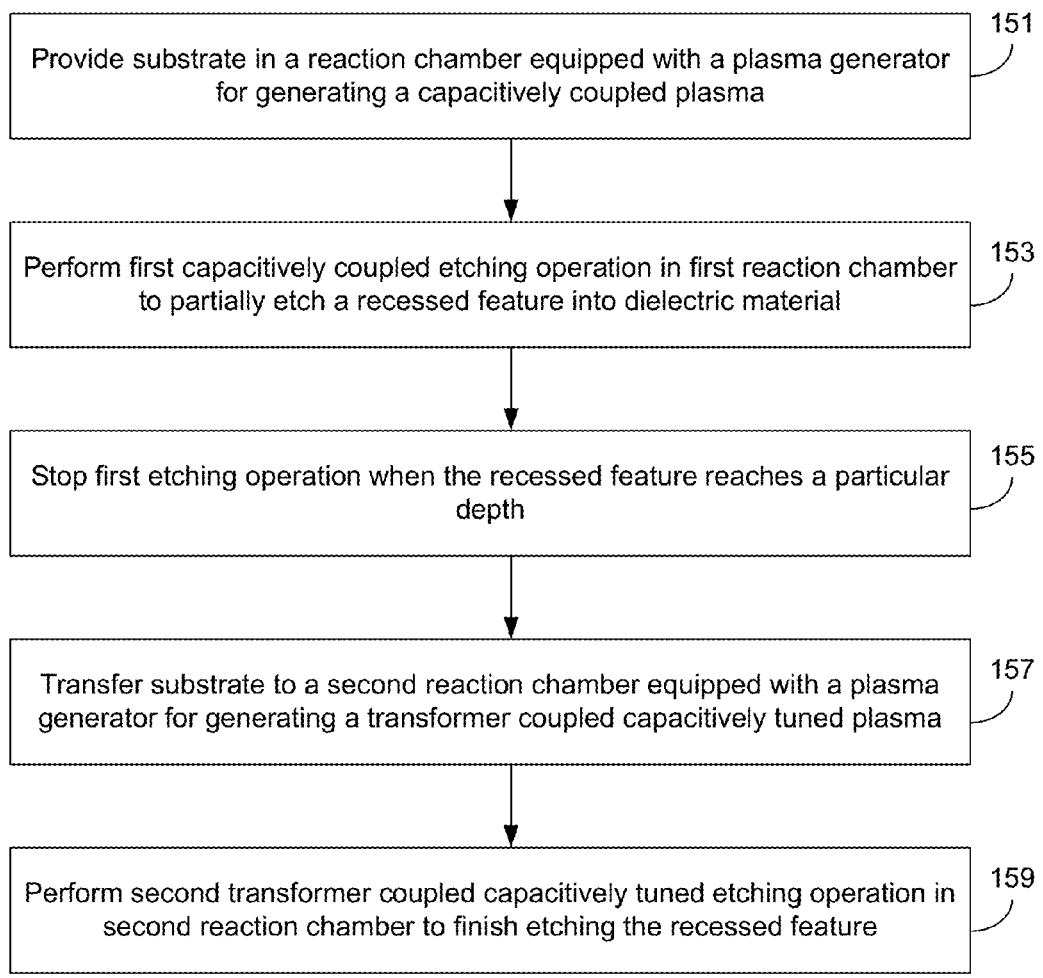
FIG. 2 is a flow chart for a method of etching a recessed feature according to various disclosed embodiments.

FIGS. 1A-1C present cross-sectional views of a partially fabricated semiconductor device 100 during a contact etch according to various embodiments. FIG. 2 presents a flowchart for performing a contact etch according to various embodiments. The method of FIG. 2 will be described in relation to the partially fabricated devices shown in FIGS. 1A-1C. The method begins at operation 151, where a substrate is provided to a first reaction chamber that is equipped with a plasma generator for generating a capacitively coupled plasma. The substrate begins as shown in FIG. 1A. Metal gate structures 130 are positioned atop an underlying semiconductor substrate layer 101. The metal gate structures 130 may include a gate dielectric 105 (e.g., $HfO_2$ or other high-k dielectric material), a metal gate 120, a cap layer 122, and a spacer 110. Between the metal gate structures 130, dielectric material 114 is present. Additional dielectric material 124 (which may be the same or different material than dielectric material 114) is provided above the metal gate structures 130 and the dielectric material 114. An additional contact etch stop layer (not shown) may be provided between the spacer 110 and the dielectric material 114. The cap layer 122 and the spacer 110 (as well as the contact etch stop layer, where present) help protect the metal gate 120 during the etch.

At operation 153, a first etching operation is performed in the first reaction chamber. The first etching operation is a capacitively coupled plasma etching operation, as described further below. Next, at operation 155, the first etching operation is stopped when the recessed feature reaches a particular depth.

FIG. 1B shows the partially fabricated semiconductor device 100 after the first etching operation 153 is complete. The first etching operation 153 stops at operation 155 with a distance 140 between the bottom of the etched recess and the underlying semiconductor material 101. In order to prevent damage to the underlying semiconductor material 101, the distance 140 should be at least as great as the mean free path of ions through the dielectric (and in certain cases the distance 140 is at least as great as the maximum penetration distance of ions in the dielectric). The ions will penetrate into the dielectric material to a range of penetration distances. The mean free path of ions in/through the dielectric is the average distance traveled by the ions in the dielectric before the ions collide with something in the dielectric. The maximum penetration distance of the ions in/through the dielectric refers to the longest distance traveled by ions in the dielectric before the ions collide with something in the dielectric. Distance 140 should be sufficiently large such that the underlying substrate 101 is substantially protected from the ions of the first etching operation 153. In many cases this is achieved when distance 140 is at least as great as the mean free path of ions in the dielectric. The mean free path of ions in dielectric, as well as the maximum penetration distance of ions in the dielectric, will depend upon, for example, ion energy, ion type, and dielectric material properties. In some cases, the mean free path (and/or the maximum penetration distance) of the ions in the dielectric is between about 1-10 nm, or more specifically between about 2-5 nm, for example about 3 nm.

Next, at operation 157, the substrate is transferred from the first reaction chamber to a second reaction chamber. The second reaction chamber is equipped with a plasma generator configured to generate an inductively coupled plasma (e.g., a transformer coupled capacitively tuned plasma). At operation 159, the substrate undergoes a second etching operation in the second reaction chamber to finish etching the recessed feature. FIG. 1C shows the partially fabricated device 100 after the second etching operation 159 is complete. The second etching operation 159 occurs in a cyclic manner in many embodiments. Typically, an atomic layer clean process is used, as described further below. The second etching operation 159 continues etching the recessed feature in a layer-by-layer manner in order to gently expose the underlying semiconductor material 101. The second etching operation 159 does not rely on directional high energy ions (contrary to the first etching operation 153), and therefore may be used to finish etching the feature without damaging the underlying semiconductor material 101. In various embodiments this underlying semiconductor material 101 includes a source regions and drain regions. In certain embodiments, the source and drain regions may be slightly raised or recessed from other portions of the substrate. In some such cases, the source and drain regions are made of silicon, silicon carbide, or silicon germanium. In a particular implementation, raised source and drain regions are made of silicon germanium.

In certain implementations, the disclosed embodiments are practiced in the context of fabricating a field effect transistor (FET), for example a FinFET. As device designs and fabrications methods have evolved, FET dimensions have continued to shrink. For example, the use of strain engineering and the use of metal gates have each allowed fabrication to occur at increasingly small technology nodes. The small dimensions used in recent technology nodes present various challenges during fabrication.

One relatively recent development in FETs is the move from planar transistors to 3D transistors. One example design is a FinFET, where a gate wraps around a conducting channel such that the gate contacts the channel on three sides. This wrap-around gate provides better electro static control over the channel, and therefore helps to reduce the leakage current of the device and to overcome other short-channel effects. In various embodiments, the disclosed etching processes may be used in the context of fabricating a FinFET device. In certain examples, the disclosed etching processes may be used in the particular context of etching a contact hole for a FinFET device. In these or other cases, the etching processes may be in the context of etching a contact hole or other recessed feature in a device that is in the 14 nm technology node (or below). As a general example, in some cases the recessed feature that forms through the disclosed methods has an opening/width (often referred to as the critical dimension) that is about 20 nm or less, with an aspect ratio of at least about 7 (after the feature is fully etched).

The various structures/layers/materials present on the substrate may have particular dimensions in some embodiments. With reference to FIG. 1A, a center-to-center distance 161 between adjacent gate structures 130 may be between about 40-100 nm, for example between about 60-80 nm. This center-to-center distance 161 may also be referred to as the gate pitch 161. The distance 162 between the sides of adjacent metal gates 120 (including the thickness of the spacers) may be between about 20-80 nm, for example between about 40-60 nm. The distance 163 between the sides of adjacent spacers 110 (excluding the thickness of the spacers) may be between about 10-60 nm, or between about 20-40 nm. The spacer 110 provided around the metal gate 120 may have a thickness between about 5-20 nm, for example between about 7-13 nm. This spacer thickness is measured in a left-right direction in FIG. 1A. The example dimensions are relevant for devices fabricated at the 14 nm node, and can be scaled as appropriate for devices fabricated at other nodes.

Further, in various embodiments, the device being fabricated includes particular materials. For example, in some cases the dielectric material 114 and/or the additional dielectric material 124 is silicon oxide (e.g., $SiO_2$) or SiOCN. The spacer 110 may be made of silicon oxynitride in some cases. In these or other embodiments, the spacer is made of silicon nitride (SiN) or a doped silicon oxide (e.g., C-doped silicon oxide). Within the semiconductor substrate level 101, the source and drain regions of a FET (e.g., FinFET) may be present. Where this is the case, the source region may be recessed/raised SiGe, Si, or SiC, and the drain region may be these same materials. In some particular examples, the metal gate 120 may be made of W, Al, Ta, and Ti based metals, and/or alloys and combinations of these metals, and the gate dielectric 105 may be a high-k dielectric such as oxynitride, or a hafnium-based material such as HfSiON, $HfO_2$, and HfSiO, or Al-based oxides, or Zr-based oxides.

First Etching Operation

The first etching operation is undertaken to etch an initial/upper portion of the recessed feature. This process typically involves use of a capacitively coupled plasma, and results in an anisotropic etch. In various embodiments, this etching operation occurs in a cyclic process. Generally speaking, the cyclic process may include a deposition step and an activation/etching step. During the deposition step, a thin layer of fluorocarbon polymer may be deposited on the surface of the substrate. During the activation/etching step, three different processes may take place including fluorocarbon polymer sputtering/thinning, activated etch, and pure sputtering. The pure sputtering step may be omitted in some cases.

Figure 3A:
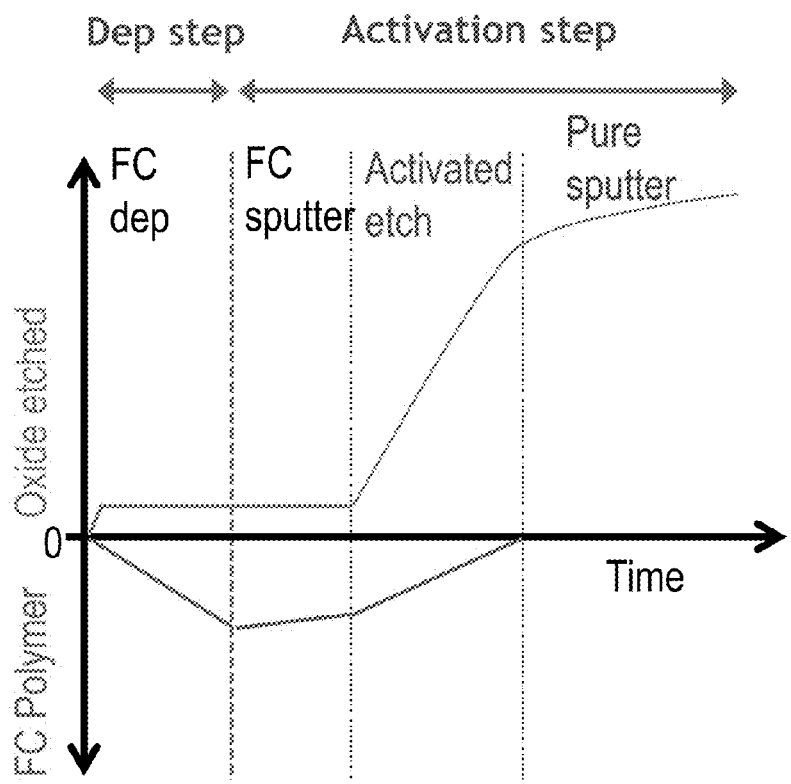
FIG. 3A illustrates a timing diagram for performing a first etching operation according to certain embodiments.
Figure 3B:
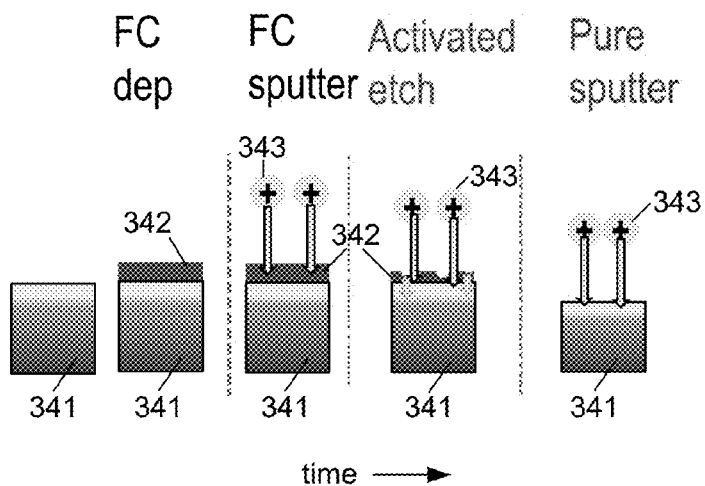
FIG. 3B depicts simplified views of a partially fabricated semiconductor device during the first etching operation in some embodiments.
Figure 3C:
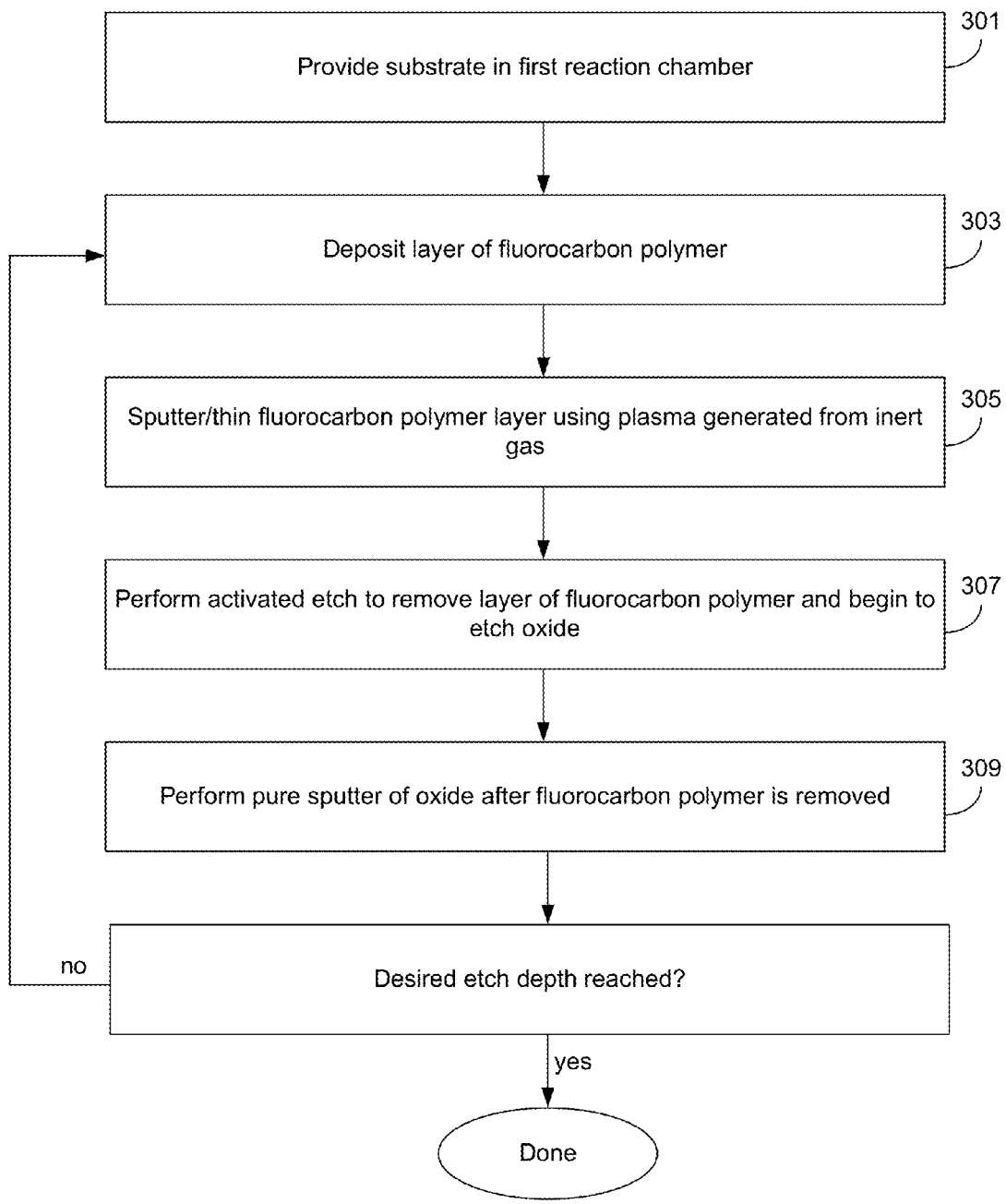
FIG. 3C is a flow chart for performing the first etching operation according to various embodiments.

FIG. 3A shows a timing diagram illustrating the first etching operation according to certain embodiments. The amount of oxide etched is shown above the x-axis, and the amount of fluorocarbon polymer present is shown below the x-axis (though both of these values are positive). FIG. 3B depicts a partially fabricated semiconductor device at various times during the etching operation shown in FIG. 3A. FIG. 3C shows a flow chart describing the process shown in FIGS. 3A and 3B. FIGS. 3A-3C will be described together.

The first etching operation begins at operation 301, where a substrate having silicon oxide 341 thereon is provided to a first reaction chamber. The substrate typically includes many additional features/structures/layers (e.g., gates, masks, etc.) that are omitted for the sake of clarity and simplicity. One of skill would understand that the etch shown in FIG. 3B selectively occurs in regions that are not protected by a mask layer.

In operation 303, a thin layer of fluorocarbon polymer 342 is deposited on the surface of the substrate. In some cases the fluorocarbon polymer 342 is deposited to a thickness on the order of angstroms. In order to deposit this fluorocarbon polymer, a fluorocarbon plasma is generated from a fluorocarbon reactant. An inert carrier gas is often provided, for example Ar. In some cases, the fluorocarbon reactant ($C_xF_y$) includes $C_4F_8$, $C_4F_6$, or combinations thereof. The flow rate of the fluorocarbon reactant may be between about 0.1-20 sccm, for example between about 0.5-5 sccm. The flow rate of the carrier gas may be between about 20-2000 sccm. The frequency used to generate the plasma may be 1-200 MHz. The RF power used to generate the plasma may be between about 10-1000 Watts, for example between about 30-300 Watts. Combinations of power at two different frequencies may also be employed with total power similar to ranges states for single frequency. Generally, a low bias is used to promote deposition and avoid etching during this step. The substrate temperature during the deposition step may be between about 20-200° C., for example between about 50-140° C. The reaction chamber pressure during this step may be between about 3-100 mTorr. The deposition step may have a duration between about 1-30 sec. In various embodiments, the fluorocarbon polymer may be deposited to a thickness between about 0.2-8 nm, for example between about 1-4 nm, during each cycle. The fluorocarbon deposition process may use various additives including, but not limited to, $N_2$, $O_2$, CO, $CO_2$, $CF_4$, $CH_2F_2$, $NF_3$, and combinations thereof. As shown in FIG. 3A, a small amount of oxide may be etched when the fluorocarbon reactant is introduced into the reaction chamber. However, due to the low bias used, the amount etched remains small, and deposition of the fluorocarbon polymer is favored. Also shown in FIG. 3A, the amount of fluorocarbon polymer increases throughout operation 303.

Next, at operation 305, the fluorocarbon polymer layer is sputtered. This sputtering may occur through ion sputtering with an inert plasma (e.g., argon, though other inert gases may also be used). As shown in FIG. 3A, the fluorocarbon polymer thickness is greatest at the end of the fluorocarbon polymer deposition operation 303, and begins to decrease toward zero at the beginning of the fluorocarbon sputtering/thinning operation 305. The amount of oxide etched remains substantially constant during this operation. Operations 305, 307, and 309 may together be referred to as an activation step or etch step, though different processes may be happening on the substrate during each operation. During the fluorocarbon polymer sputtering/thinning step 305, the flow rate of gas used to generate the plasma may be between about 20-2000 sccm, for example between about 50-400 sccm. This gas is typically an inert gas such as argon. The frequencies used to generate the plasma may be, for example, 2 MHz and 60 MHz. The 2 MHz RF powers used to generate the plasma may be between about 0-300 Watts, for example between about 30-100 Watts. The 60 MHz RF powers used to generate the plasma may be between about 30-600 Watts, for example between about 50-200 Watts. Generally, a moderate bias (higher than the bias used during the fluorocarbon deposition step 303) is used, which can help the ions activate the oxide surface underlying the layer of fluorocarbon polymer. The substrate temperature during the fluorocarbon sputtering/thinning step may be between about 60-100° C., or between about 80-110° C. The reaction chamber pressure during this step may be between about 10-40 mTorr. The fluorocarbon sputtering/thinning step may have a duration between about 2-10 sec. In some embodiments, the deposition conditions (other than the bias) do not change between operations 303 and 305.

At operation 307, an activated etch occurs. Ions penetrate the fluorocarbon film to activate the interface between the layer of fluorocarbon polymer and the oxide. Such activation may begin during operation 305. During this step, the fluorocarbon polymer and oxide are both removed, as shown in FIG. 3A. During the activated etch step 307, the flow rate of gas used to generate the plasma may be between about 40-1000 sccm, for example between about 40-100 sccm. This gas is typically an inert gas such as argon. The frequency used to generate the plasma may be, for example, 2 MHz and 60 MHz. The 2 MHz RF power used to generate the plasma may be between about 0-300 Watts, e.g., between about 30-100 Watts, and the RF power at 60 MHz may be between about 30-600 Watts, for example between about 50-200 Watts. The substrate temperature during the activated etch step 307 may be between about 60-100° C., or between about 80-110° C. The reaction chamber pressure during this step may be between about 10-40 mTorr. The activated etch operation 307 may have a duration between about 2-10 sec. The activated etch operation 307 may use additives such as $N_2$, $O_2$, CO, $CO_2$, $CF_4$, $C_4F_8$, $CH_2F_2$, $NF_3$, and combinations thereof, among others. At the end of the activated etch operation 307, the fluorocarbon polymer is substantially completely removed, as shown in FIG. 3A.

Next, at operation 309, a pure sputtering operation may occur. In some cases this step may be omitted, and etching substantially stops after the fluorocarbon polymer is removed. Whether or not pure physical sputtering occurs depends largely on the energy of the ions impacting the substrate. As shown in FIG. 3A, the amount of oxide etched continues to increase during the pure sputtering operation. However, the rate at which oxide is removed during this pure sputtering operation 309 may be less than the rate at which oxide is removed during the activated etch operation 307. During the pure sputtering step 309, the flow rate of gas used to generate the plasma may be between about 20-2000 sccm, for example between about 50-400 sccm. This gas is typically an inert gas such as argon. The frequencies used to generate the plasma may be, for example, 2 MHz and 60 MHz. The 2 MHz RF power used to generate the plasma may be between about 0-300 Watts, for example between about 30-100 Watts. The 60 MHz RF power used to generate the plasma may be between about 30-600 Watts, for example between about 50-200 Watts. The substrate temperature during the pure sputtering operation 309 may be between about 60-100° C., or between about 80-110° C. The reaction chamber pressure during this step may be between about 10-40 mTorr. The pure sputtering operation 309 may have a duration between about 2-10 sec.

After operation 309 is complete, it is determined in operation 311 whether a sufficient amount of oxide material has been removed (i.e., whether the etch depth is sufficiently high). If so, the first etching operation is complete. If not, the etching process cycles back to operation 303, and additional etching takes place. Typically, many cycles are used during the first etching process. In some embodiments, the number of cycles is between about 5-250, for example between about 30-80. The etch depth achieved in the first etching operation may be between about 10-200 nm, for example between about 60-120 nm.

The etch depth achieved in each cycle is dependent upon the reaction conditions used, and in particular, whether or not the fluorocarbon polymer is fully removed during each cycle. In many embodiments, the fluorocarbon polymer is fully removed or substantially fully removed during each cycle.

The fluorocarbon polymer should be sufficiently thin to permit ion-based activation of the oxide underlying the fluorocarbon polymer.

The etch process described in relation to FIGS. 3A-3C can be used to selectively etch oxide material as opposed to nitride material, as is often the case where a contact hole is being etched. In this case, the etch chemistry used (e.g., $C_xF_y$, for example $C_4F_6$) is chosen such that the fluorocarbon polymer that forms over the nitride etches more slowly than the fluorocarbon polymer that forms over the oxide. In certain implementations, the selectivity of the etch is approximately between about 5-15. By choosing an appropriate duration for the activation/etching steps (i.e., operations 303-309), an etching process can result in removal of all fluorocarbon polymer from the oxide and incomplete removal of the fluorocarbon polymer from the nitride. Over multiple cycles, the oxide material is etched while the fluorocarbon polymer builds up and protects the nitride material.

As noted above, the first etching operation continues until reaching a desired etch depth. In various embodiments herein, the first etch stops at or before the time at which the remaining oxide material reaches a thickness that corresponds to the mean free path of ions in the dielectric. With reference to FIG. 1B, distance 140 may be greater than or about equal to the mean free path of ions in the dielectric. If an additional etch stop layer is provided between the dielectric 114 and the underlying semiconductor substrate level 101, distance 140 includes the thickness of this additional etch stop layer. By stopping the first etch operation at this point, the damage to the underlying semiconductor layer can be prevented. In some embodiments, the thickness of remaining dielectric after the first etching operation (represented by distance 140 of FIG. 1B) is between about 2-15 nm, or between about 5-10 nm. In these or other cases, this thickness may be at least about 2 nm, for example at least about 5 nm.

The determination of when to stop the first etching operation may be based on several factors including, but not limited to, the dielectric material being etched, the etch chemistry, plasma conditions, bias conditions, flow rates, pressure, temperature, etc. In some implementations, the etch is stopped after a particular duration or number of cycles. The appropriate stopping time/number of cycles may be based on empirical results obtained using the particular processing conditions being applied. For instance, a series of test wafers may be etched for particular durations/number of cycles to reach different depths using the first etching operation. These wafers may then be further examined to determine whether there is damage to the underlying semiconductor lattice for each wafer. In some cases, the etching duration/number of cycles used corresponds to the longest duration and/or greatest number of cycles that does not result in damage to the underlying substrate (or that results in an acceptably low amount of damage to the underlying substrate). An acceptably low amount of damage in some embodiments is about 10 nm or less of substrate thickness becoming damaged, for example less than about 5 nm or less, or about 3 nm or less.

In these or other embodiments, the end point of the first etching operation may be detected in situ in real time. Such methods are frequently referred to as in situ end point metrology. In some embodiments, optical techniques are used to detect when to stop the first etching operation.

Second Etching Operation

After the first etching operation in the first reaction chamber, the substrate may be transferred to a second reaction chamber equipped with a plasma generator for generating an inductively coupled plasma (e.g., a transformer coupled capacitively tuned plasma). Ion energy and ion density are controlled differently the first reaction chamber (with the capacitively coupled plasma) compared to the second reaction chamber (with the inductively coupled plasma). In a capacitively coupled plasma, the ion energy is controlled at least in part by the bias applied to the substrate. This substrate bias attracts ions toward the substrate in a directional manner. Typically, high substrate bias/ion energies are provided for the reasons discussed above by applying a high degree of bias on the substrate (compared to a showerhead, for instance). On the other hand, where an inductively coupled plasma is used, the ion energy is controlled by the rate at which current is supplied to coils that produce the plasma. Advantageously, the inductively coupled plasma may be generated without applying a strong bias to the substrate. Without a strong bias applied to the substrate, the risk that ions penetrate through the dielectric to damage the underlying semiconductor layer is substantially reduced.

The second etching operation is typically an atomic layer clean process that results in self-limiting removal of about a monolayer of material in each cycle. Atomic layer clean processes are similar to atomic layer deposition processes, where a surface reaction may be controlled with atomic layer precision. Atomic layer cleaning methods are further discussed and described in U.S. patent application Ser. No. 14/446,203, filed Jul. 29, 2014, and titled "METHODS AND APPARATUSES FOR ATOMIC LAYER CLEANING OF CONTACTS AND VIAS," which is herein incorporated by reference in its entirety.

FIGS. 4A-4E illustrate a partially fabricated semiconductor device as it undergoes the second etching operation (sometimes referred to as a cleaning operation) according to various embodiments. Similar to FIG. 3B, only the oxide material 410 is shown, though it is understood that additional features/structures/layers are typically present.

As shown in FIG. 4A, in some embodiments, the second etching operation may begin by introducing a chemical species used for cleaning/etching 420 (i.e., a cleaning reactant species) into a processing chamber in order that the cleaning species 420 be delivered to the surface of the substrate, and particularly to any exposed oxide 410 (as indicated by the downward arrows in the figure). In some embodiments, the cleaning species may be a halogen-containing species, and in certain such embodiments, a fluorine-containing species such as $XeF_2$, $BrF_3$, $IF_5$, $ClF_3$, etc. may be used. In some embodiments, the cleaning species may be a halogen- and carbon-containing species such as fluorocarbons, for example, $C_4F_8$.

After its introduction into the processing chamber, the cleaning species 420 (or a portion of the cleaning species) adsorbs onto the surface of the oxide material 410 such that it forms an adsorption-limited layer atop the oxide 410 (and/or atop any contaminants thereon). Oftentimes this adsorption-limited layer may be described as a monolayer, roughly having a uniform thickness of a single adsorbed molecule. Where conditions are such that this is the case, monolayer formation is oftentimes a consequence of the chemisorption process requiring an exposed surface on which to adsorb—i.e., a single adsorbed atom or molecule at a given point on the surface prevents further adsorption at that point.

Such adsorption of a monolayer of cleaning species 420 onto the oxide 410 to be removed is schematically illustrated in FIG. 4B. FIG. 4B schematically illustrates the cleaning species 420 binding directly to the oxide 410 to be removed. While the cleaning methods disclosed herein are not limited to regimes where there is actual chemical bonding between cleaning species 420 and the surface 430 of oxide 410, in some cases chemical bonding, such as covalent bonding, may occur. In other cases, other forms of attractive interactions may exist between cleaning species and the oxide upon adsorption of the cleaning species onto the surface 430 of the oxide 410.

The cleaning species and molecules in the surface 430 of oxide 410 are portrayed in FIGS. 4A-4D as "balls" and their binding to each other as "sticks," yet it should be noted that each such species portrayal as a single "ball" should not be interpreted to imply that each such species are necessarily atomic species. Rather, the cleaning species and the oxide species may be multi-atom molecular species as well, depending on the embodiment. For instance, in many cases the oxide species removed is silicon oxide, $SiO_x$. The simple "ball-and-stick" drawings are used to provide a basic illustration of the surface adsorption process. It should also be noted that the adsorbed species may not constitute the complete cleaning species introduced into the processing chamber, despite the fact that FIGS. 4A-4B show, for sake of simplicity, the same species being introduced and subsequently adsorbed. In other words, in some embodiments, only a portion (e.g., fragment) of the cleaning species may be adsorbed.

For instance, if the cleaning species introduced into the processing chamber is $XeF_2$, the adsorbed cleaning species may be atomic fluorine (F) radicals or fluorine atoms covalently bonded to oxide present on the substrate surface (e.g., within an etched feature). Thus, in this example, it might be said that technically F is the species that does the cleaning Nevertheless, for sake of clarity and simplicity, the cleaning species introduced into the processing chamber ($XeF_2$, in this example) and the species that is actually adsorbed (F in this example) both may be referred to herein as the "cleaning species," with the understanding that the phrase refers to a compound which is, or is the source of, the species which is actually adsorbed onto the surface and effectuates the cleaning/etching as described herein.

It should also be noted that the cleaning species may be adsorbed onto both the bottom portion of a recessed feature (e.g., partially etched contact hole) and on the sidewalls of the feature. However, for the reasons described below, the cleaning species adsorbed onto the sidewalls do not necessarily result in the cleaning and potentially etching away of the sidewalls. Selective etching at the bottom portion of a feature can be achieved using a directed electromagnetic (EM) field to direct the ions toward the substrate at a normal angle.

After adsorption has occurred, as shown in FIG. 4C, excess un-adsorbed (possibly including desorbed) cleaning species are removed from the processing chamber in order to prevent their interference with the activation and reaction of the chemisorbed species (e.g., potential concurrent gas-phase reaction) in subsequent steps of the cleaning process. In some embodiments, removal of excess un-adsorbed cleaning species may be accomplished by pumping un-adsorbed cleaning species out of the processing chamber. In some embodiments, removal may be accomplished by purging the processing chamber with an inert gas. In some embodiments, a combination sequence of pumping the reaction chamber down to a base pressure to remove un-adsorbed species and then purging, or vice versa, may be employed.

Once an adsorption-limited layer of the cleaning species is formed on the surface 430 of oxide 410 and un-adsorbed precursor removed from the processing chamber, a reaction is activated between the adsorbed cleaning species and the oxide. As shown in FIG. 4D, this results in the etching away of some of the surface. FIG. 4C schematically illustrates the adsorption-limited layer being exposed to a low energy molecular/atomic beam 440 in order to activate the surface reaction, however, other reaction-activation techniques may be utilized as well. For instance, in some embodiments, the reaction may be activated by reacting an additional chemical species with the cleaning species (e.g., fluorine and/or fluorine-containing species) of the adsorption-limited layer. In other embodiments, the reaction may be thermally activated—i.e., thermally energy is provided to the adsorption-limited layer in order to cause the surface reaction. In some embodiments, the reaction may be plasma activated.

Finally, in some embodiments, after the surface-mediated cleaning reaction has proceeded, by-product(s) generated by the cleaning reaction in FIG. 4D may be removed from the processing chamber as shown in FIG. 4E. In embodiments where the adsorption limited layer contains fluorine as a cleaning species, the by-products may include fluorine-containing species.

Figure 4F:
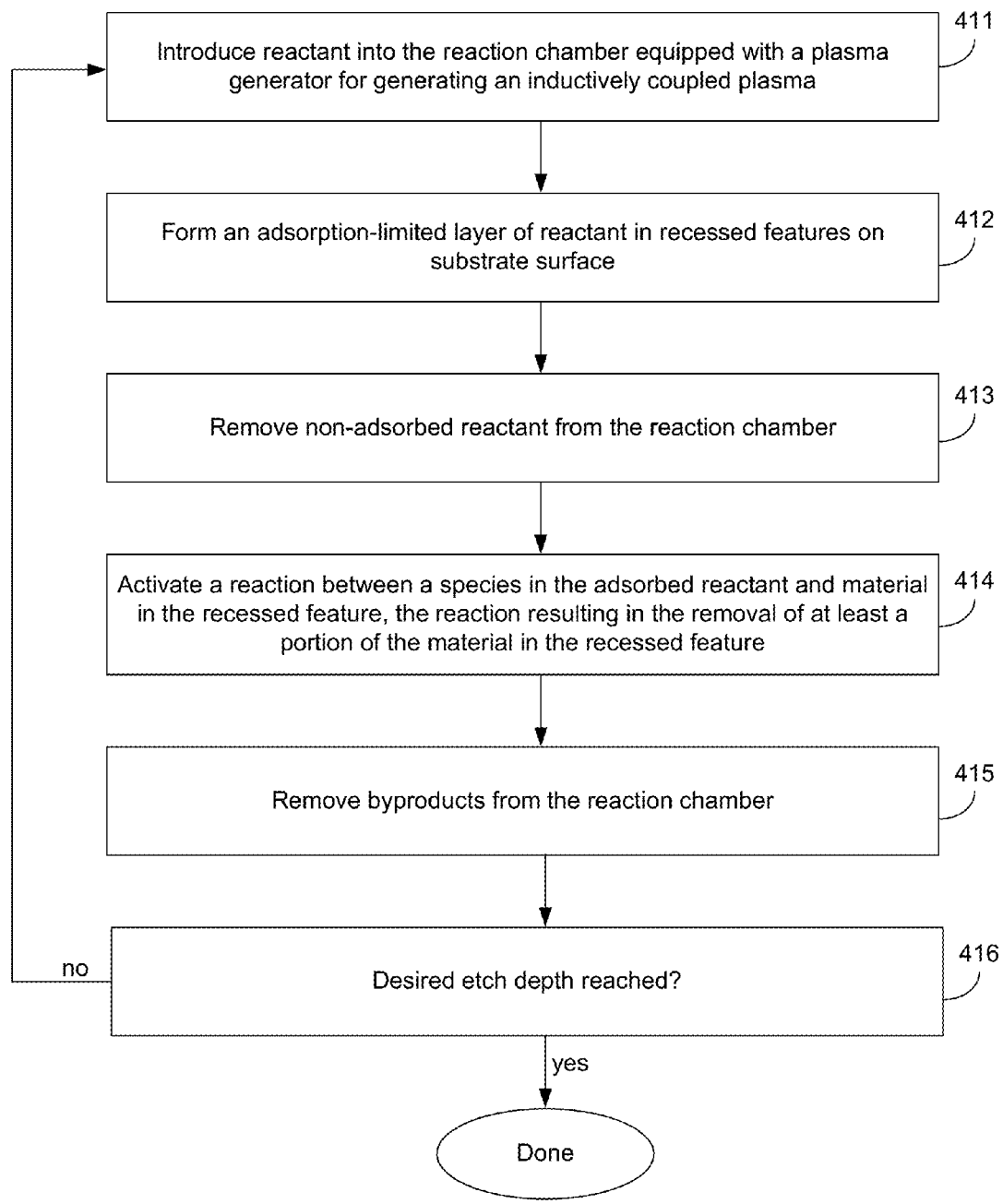
FIG. 4F is a flow chart describing a method of performing the second etching operation in certain embodiments.

FIGS. 4A-4E constitute one cycle of atomic layer clean (ALC). However, since each cycle only constitutes the reaction of a single adsorption-limited layer of cleaning species, typically only a single monolayer of oxide is removed as shown in FIG. 4E, and so multiple cycles are typically performed in order to remove the remaining dielectric and expose the underlying semiconductor layer. Thus, this repetition of cleaning cycles is schematically indicated in the figures by the arrow joining FIG. 4E with FIG. 4A. Likewise, FIG. 4F provides a flowchart view of a cyclic ALC process. As shown in the figure, the cyclic ALC process begins with the operation 411 of introducing a reactant (e.g., a cleaning reactant) into the processing chamber, followed by operation 412 of forming an adsorption-limited layer in the partially formed recessed features on the substrate. After the adsorption operation, the process continues by removing un-adsorbed reactant species from the processing chamber in operation 413. Finally, in operation 414, activation of a reaction between the adsorbed reactant layer and oxide material is accomplished. As stated in the flowchart, the reaction results in the removal of at least a portion of the oxide material in the recessed features. Lastly, in some embodiments, there may be an additional operation 415 of removing byproduct species generated by the reaction from the processing chamber. Typically, many cycles are performed before reaching the desired etch depth. Thus, after activating the reaction in operation 414 and optionally removing reaction by-product in operation 415, the process proceeds to logic block 416 where it is determined whether the etch has reached a desired etch depth. If the desired etch depth has not been reached (e.g., where less than N cycles have been performed, where N is the total number of ALC cycles desired) the process proceeds to repeat operations 411-414 (and optionally 415) again. If the desired etch depth has been reached (e.g., where N cycles have been performed), the process ends.

Referring again to FIG. 4D and to operation 414 in FIG. 4F, when a molecular beam is used to activate the surface reaction, the beam may include ions, free-radicals, and neutral non-radical species, and exposure of the adsorption-limited layer to such species may serve to activate the surface reaction. If ionized species are used to activate the reaction, they may be plasma-generated. The plasma may be formed from/ comprise an inert gas such as He, Ar, Ne, Kr, and/or Xe. Ions of the plasma may be directed by an applied electromagnetic field so as to travel (and contact the substrate) with an energy substantially perpendicular to the plane of the substrate, as discussed further below. Of course, such an applied electromagnetic field may also accelerate the ions to a particularly desired kinetic energy level. Though this may resemble an ion-based sputter etch technique, the difference here is that the energy transferred by the impinging ions need only be sufficient to activate the surface reaction of the adsorbed cleaning species, rather than sufficient to collision-ally ablate the oxide from the surface from sheer kinetic energy alone. Thus, for example, in the ALC techniques disclosed herein, the ion species may contact the adsorption-limited layer (as in FIG. 4D) by impacting it with a relative kinetic energy of less than 100 eVs, or a relative kinetic energy of less than 30 eVs, or even less than 10 eVs. Of course, if free-radical species are used to activate the reaction, these are oftentimes plasma-generated as well, and also typically have a lower kinetic energy. In any event, because the impinging molecular beam used to activate the surface reaction imparts much less energy to the underlying substrate than an ion-based sputter etch, the atomic layer clean (ALC) technique has the potential to be far less damaging to the underlying surface.

As just described, in some embodiments, the surface reaction between the adsorbed cleaning species and the oxide may be plasma-activated. Thus, the low energy molecular beam schematically illustrated in FIG. 4D may be created by generating a plasma in the processing chamber, or by introducing a remotely-generated plasma into the processing chamber, or by a combination of the foregoing, etc. Typically, if ions are used to activate the surface reaction, an ion-based plasma is generated within the processing chamber. In various embodiments, an in-situ inductively coupled plasma is utilized, for example a transformer coupled capacitively tuned plasma. If free-radical species are used to activate the surface reaction, they may be introduced into the processing chamber from a free-radical-based plasma generated remotely from the processing chamber—i.e., from a remote free-radical-based plasma source. In some embodiments, the plasma may contain a substantial number of both free-radical species and ionic species. In some embodiments, the plasma may be an argon-based ionized plasma, albeit—as described above—typically with ions having a mean kinetic energy substantially less than what would be used in a standard Ar-plasma-based surface etch technique.

Note that the adsorbed layer of cleaning species may oftentimes be described as a conformal layer—i.e., having a substantially uniform thickness and which substantially conforms to the shape of the features onto which it is adsorbed. And, since the thickness of the adsorbed layer is substantially uniform, the amount of reactive cleaning species to which any portion of the substrate is exposed during the reactive process is substantially controllable, selective, and predictable.

Plasma activation of the adsorbed cleaning species may act as an additional mechanism for controlling the specificity of the cleaning/etching process. In particular, an applied electromagnetic field (EM) may be used to direct the flux of one or more species of the plasma towards the base/bottom of the electrical contact feature (as shown in FIG. 4D). If in so doing, the impinging species is directed so as to travel in a direction substantially perpendicular to the plane of the substrate, the impinging species will collide with much less frequently with a feature's sidewalls than with its base/bottom and hence the cleaning reaction will be preferentially activated at the base of the feature rather than on the sidewalls thereby working to preserve the CD and AR of the feature.

Note that the applied EM field may generate a constant flux of impacting species, or it may generate pulses of impacting species through pulsation of the EM field. In some embodiments, ions may be directed by the EM field to impact the adsorbed cleaning species with a kinetic energy below the sputter threshold of the impacted material. In the energy regime below the sputter threshold, the impacting particles have sufficient energy to activate a reaction of the adsorbed cleaning species, but not enough energy to remove material via an ion or ion-assisted etch process. Thus, in order to ensure that oxide removal occurs via an activated chemical cleaning process rather than an ion or ion-assisted etch process, ions may be directed by an applied EM field such that they impact the adsorbed cleaning species with a kinetic energy of less than 100 electron volts (eVs), or in certain such embodiments, with a kinetic energy of less than 30 eVs, or even yet more particularly, of less than 10 eVs. Depending on the embodiment, the ion species comprising the plasma may be hydrogen ions, and/or ions of an inert gas such as argon, for example.

As noted, the second etch operation completes the contact hole etch. In some embodiments, the distance etched in the second etching operation (not counting the distance etched in the first etching operation) may be between about 5-30 nm, for example between about 2-10 nm. The second etching operation may bring the total etch depth (counting the etch depth achieved in the first etching operation) to between about 45-180 nm, for example between about 50-90 nm. This depth will depend primarily on the thickness of the dielectric being etched. In some implementations, the ratio between the distance etched in the first etching operation (D1) compared to the distance etched in the second operation (D2) (i.e., D1:D2) is between about 8:2 and about 9:1 (i.e., between about 80-90% of the total etch distance is etched in the first etching operation in some cases). In certain embodiments, the contact hole has an aspect ratio between about 1-3, for example between about 1.2-1.8, after the second etching operation is complete.

After the second etch operation is complete and the contact hole is fully etched, the contact hole may be filled with one or more materials (e.g., metals, metal nitrides, etc.). Methods and apparatus for forming the contact are further discussed in the following U.S. Patent Applications, each of which is herein incorporated by reference in its entirety: U.S. patent application Ser. No. 13/862,048, filed Apr. 12, 2013, and titled "CVD BASED METAL/SEMICONDUCTOR OHMIC CONTACT FOR HIGH VOLUME MANUFACTURING APPLICATIONS"; and U.S. patent application Ser. No. 14/464,475, filed Aug. 20, 2014, and titled "METHOD TO TUNE TIOX STOICHIOMETRY USING ATOMIC LAYER DEPOSITED TI FILM TO MINIMIZE CONTACT RESISTANCE FOR TIOX/TI BASED MIS CONTACT SCHEME FOR CMOS."

Various embodiments herein are presented in the context of etching a recess in dielectric material, where the recess is a contact hole into which an electrical contact is later formed. However, the embodiments are not so limited, and the disclosed methods and apparatus are useful in any context where a recessed feature is etched in dielectric material positioned above an underlying material that is subject to damage from ion bombardment.

Apparatus

The methods described herein may be performed by any suitable apparatus. A suitable apparatus includes hardware for accomplishing the process operations and a system controller having instructions for controlling process operations in accordance with the present invention. For example, in some embodiments, the hardware may include one or more process stations included in a process tool. In many embodiments, the first etching operation occurs in a first reaction chamber and the second etching operation occurs in a second reaction chamber, where the first reaction chamber is configured to produce a capacitively coupled plasma, and the second reaction chamber is configured to produce an inductively coupled plasma (e.g., a transformer coupled capacitively tuned plasma). The two reaction chambers may be provided together on a single platform, for example in a cluster tool as described further below.

In another embodiment, both the first and second etching operations may be performed in a single reaction chamber equipped to generate a capacitively coupled plasma under certain conditions and an inductively coupled plasma (e.g., a transformer coupled capacitively tuned plasma) under other conditions. In this case, there is no need to transfer the substrate from one reaction chamber to another between the first and second etching operations, since both operations take place in the same reaction chamber.

Apparatus for First Etching Operation

As noted above, the reaction chamber for performing the first etching operation is typically configured to produce a capacitively coupled plasma. One example apparatus that may be used is a Flex™ reaction chamber, for example from the 2300® Flex™ product family available from Lam Research Corporation of Fremont, Calif.

Figure 5A:
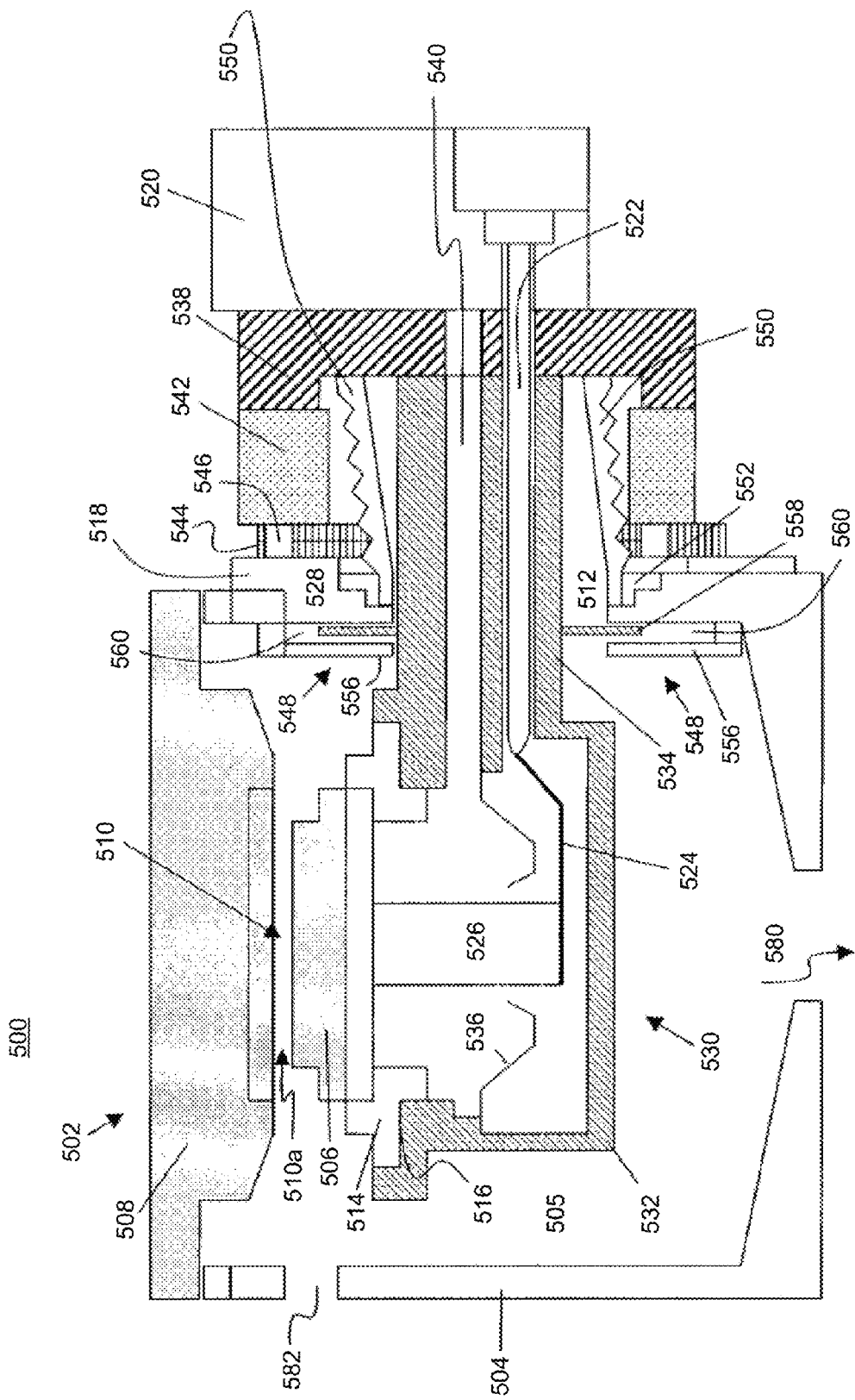
FIGS. 5A-5C illustrate a cross-sectional view of a reaction chamber for performing the first etching operation in certain embodiments.
Figure 5B:
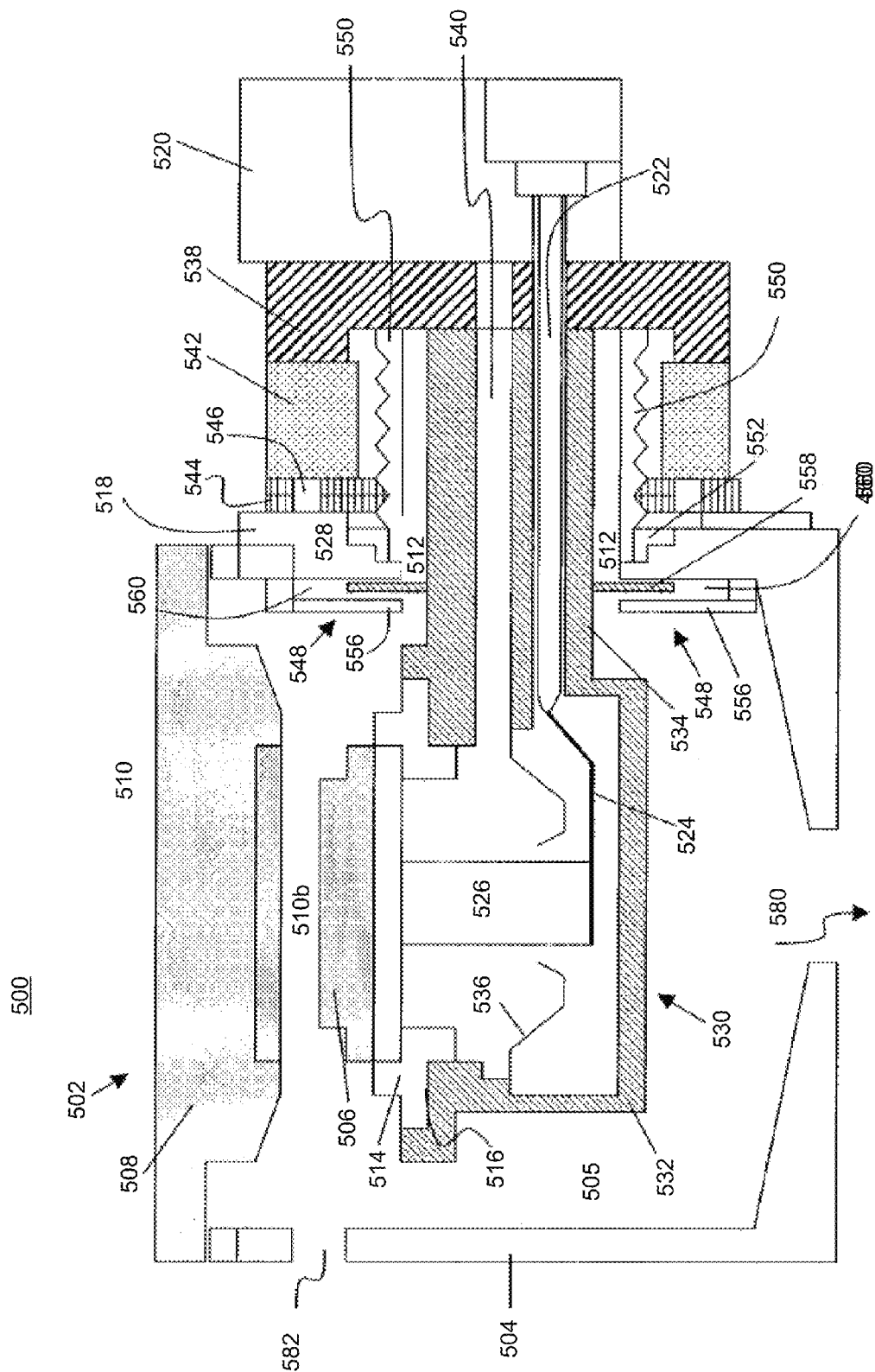
Figure 5C:
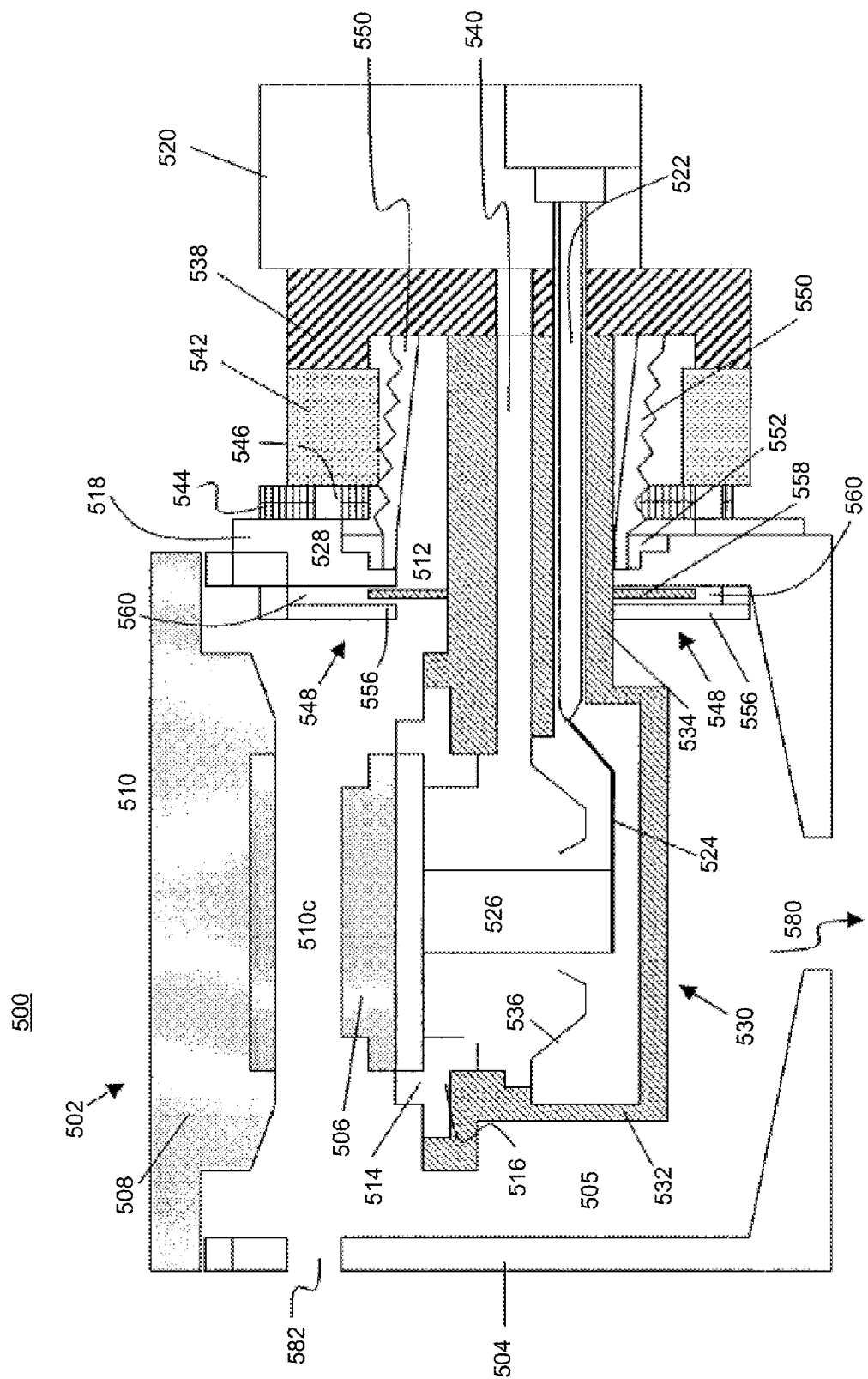

FIGS. 5A-5C illustrate an embodiment of an adjustable gap capacitively coupled confined RF plasma reactor 500 that may be used for performing the first etching operation described herein. As depicted, a vacuum chamber 502 includes a chamber housing 504, surrounding an interior space housing a lower electrode 506. In an upper portion of the chamber 502 an upper electrode 508 is vertically spaced apart from the lower electrode 506. Planar surfaces of the upper and lower electrodes 508, 506 are substantially parallel and orthoganol to the vertical direction between the electrodes. Preferably the upper and lower electrodes 508, 506 are circular and coaxial with respect to a vertical axis. A lower surface of the upper electrode 508 faces an upper surface of the lower electrode 506. The spaced apart facing electrode surfaces define an adjustable gap 510 therebetween. During operation, the lower electrode 506 is supplied RF power by an RF power supply (match) 520. RF power is supplied to the lower electrode 506 though an RF supply conduit 522, an RF strap 524 and an RF power member 526. A grounding shield 536 may surround the RF power member 526 to provide a more uniform RF field to the lower electrode 506. As described in commonly-owned U.S. Pat. No. 7,732,728, the entire contents of which are herein incorporated by reference, a wafer is inserted through wafer port 582 and supported in the gap 510 on the lower electrode 506 for processing, a process gas is supplied to the gap 510 and excited into plasma state by the RF power. The upper electrode 508 can be powered or grounded.

In the embodiment shown in FIGS. 5A-5C, the lower electrode 506 is supported on a lower electrode support plate 516. An insulator ring 514 interposed between the lower electrode 506 and the lower electrode support plate 516 insulates the lower electrode 506 from the support plate 516.

An RF bias housing 530 supports the lower electrode 506 on an RF bias housing bowl 532. The bowl 532 is connected through an opening in a chamber wall plate 518 to a conduit support plate 538 by an arm 534 of the RF bias housing 530. In a preferred embodiment, the RF bias housing bowl 532 and RF bias housing arm 534 are integrally formed as one component, however, the arm 534 and bowl 532 can also be two separate components bolted or joined together.

The RF bias housing arm 534 includes one or more hollow passages for passing RF power and facilities, such as gas coolant, liquid coolant, RF energy, cables for lift pin control, electrical monitoring and actuating signals from outside the vacuum chamber 502 to inside the vacuum chamber 502 at a space on the backside of the lower electrode 506. The RF supply conduit 522 is insulated from the RF bias housing arm 534, the RF bias housing arm 534 providing a return path for RF power to the RF power supply 520. A facilities conduit 540 provides a passageway for facility components. Further details of the facility components are described in U.S. Pat. Nos. 5,948,704 and 7,732,728 and are not shown here for simplicity of description. The gap 510 is preferably surrounded by a confinement ring assembly or shroud (not shown), details of which can be found in commonly owned published U.S. Pat. No. 7,740,736 herein incorporated by reference. The interior of the vacuum chamber 502 is maintained at a low pressure by connection to a vacuum pump through vacuum portal 580.

The conduit support plate 538 is attached to an actuation mechanism 542. Details of an actuation mechanism are described in commonly-owned U.S. Pat. No. 7,732,728 incorporated herein by above. The actuation mechanism 542, such as a servo mechanical motor, stepper motor or the like is attached to a vertical linear bearing 544, for example, by a screw gear 546 such as a ball screw and motor for rotating the ball screw. During operation to adjust the size of the gap 510, the actuation mechanism 542 travels along the vertical linear bearing 544. FIG. 5A illustrates the arrangement when the actuation mechanism 542 is at a high position on the linear bearing 544 resulting in a small gap 510a. FIG. 5B illustrates the arrangement when the actuation mechanism 542 is at a mid position on the linear bearing 544. As shown, the lower electrode 506, the RF bias housing 530, the conduit support plate 538, the RF power supply 520 have all moved lower with respect to the chamber housing 504 and the upper electrode 508, resulting in a medium size gap 510b.

FIG. 5C illustrates a large gap 510c when the actuation mechanism 542 is at a low position on the linear bearing. Preferably, the upper and lower electrodes 508, 506 remain coaxial during the gap adjustment and the facing surfaces of the upper and lower electrodes across the gap remain parallel.

This embodiment allows the gap 510 between the lower and upper electrodes 506, 508 in the CCP chamber 502 during multi-step process recipes (BARC, HARC, and STRIP etc.) to be adjusted, for example, in order to maintain uniform etch across a large diameter substrate such as 300 mm wafers or flat panel displays. In particular, this chamber pertains to a mechanical arrangement that permits the linear motion necessary to provide the adjustable gap between lower and upper electrodes 506, 508.

FIG. 5A illustrates laterally deflected bellows 550 sealed at a proximate end to the conduit support plate 538 and at a distal end to a stepped flange 528 of chamber wall plate 518. The inner diameter of the stepped flange defines an opening 512 in the chamber wall plate 518 through which the RF bias housing arm 534 passes. The distal end of the bellows 550 is clamped by a clamp ring 552.

The laterally deflected bellows 550 provides a vacuum seal while allowing vertical movement of the RF bias housing 530, conduit support plate 538 and actuation mechanism 542. The RF bias housing 530, conduit support plate 538 and actuation mechanism 542 can be referred to as a cantilever assembly. Preferably, the RF power supply 520 moves with the cantilever assembly and can be attached to the conduit support plate 538. FIG. 5B shows the bellows 550 in a neutral position when the cantilever assembly is at a mid position. FIG. 5C shows the bellows 550 laterally deflected when the cantilever assembly is at a low position.

A labyrinth seal 548 provides a particle barrier between the bellows 550 and the interior of the plasma processing chamber housing 504. A fixed shield 556 is immovably attached to the inside inner wall of the chamber housing 504 at the chamber wall plate 518 so as to provide a labyrinth groove 560 (slot) in which a movable shield plate 558 moves vertically to accommodate vertical movement of the cantilever assembly.

The outer portion of the movable shield plate 558 remains in the slot at all vertical positions of the lower electrode 506.

In the embodiment shown, the labyrinth seal 548 includes a fixed shield 556 attached to an inner surface of the chamber wall plate 518 at a periphery of the opening 512 in the chamber wall plate 518 defining a labyrinth groove 560. The movable shield plate 558 is attached and extends radially from the RF bias housing arm 534 where the arm 534 passes through the opening 512 in the chamber wall plate 518. The movable shield plate 558 extends into the labyrinth groove 560 while spaced apart from the fixed shield 556 by a first gap and spaced apart from the interior surface of the chamber wall plate 518 by a second gap allowing the cantilevered assembly to move vertically. The labyrinth seal 548 blocks migration of particles spalled from the bellows 550 from entering the vacuum chamber interior 505 and blocks radicals from process gas plasma from migrating to the bellows 550 where the radicals can form deposits which are subsequently spalled.

FIG. 5A shows the movable shield plate 558 at a higher position in the labyrinth groove 560 above the RF bias housing arm 534 when the cantilevered assembly is in a high position (small gap 510a). FIG. 5C shows the movable shield plate 558 at a lower position in the labyrinth groove 560 above the RF bias housing arm 534 when the cantilevered assembly is in a low position (large gap 510c). FIG. 5B shows the movable shield plate 558 in a neutral or mid position within the labyrinth groove 560 when the cantilevered assembly is in a mid position (medium gap 510b). While the labyrinth seal 548 is shown as symmetrical about the RF bias housing arm 534, in other embodiments the labyrinth seal 548 may be asymmetrical about the RF bias arm 534.

The apparatus also typically includes a controller for controlling the process operations as described herein. The controller is further described below.

Apparatus for Second Etching Operation

The second etching operation may be performed in a different reaction chamber than the first etching operation. Typically, the reaction chamber for performing the second etching operation is configured to produce an inductively coupled plasma (e.g., transformer coupled capacitively tuned plasma). One example apparatus that may be used is the 2300® Kiyo® Product Family, available from Lam Research Corporation of Fremont, Calif.

Figure 6:
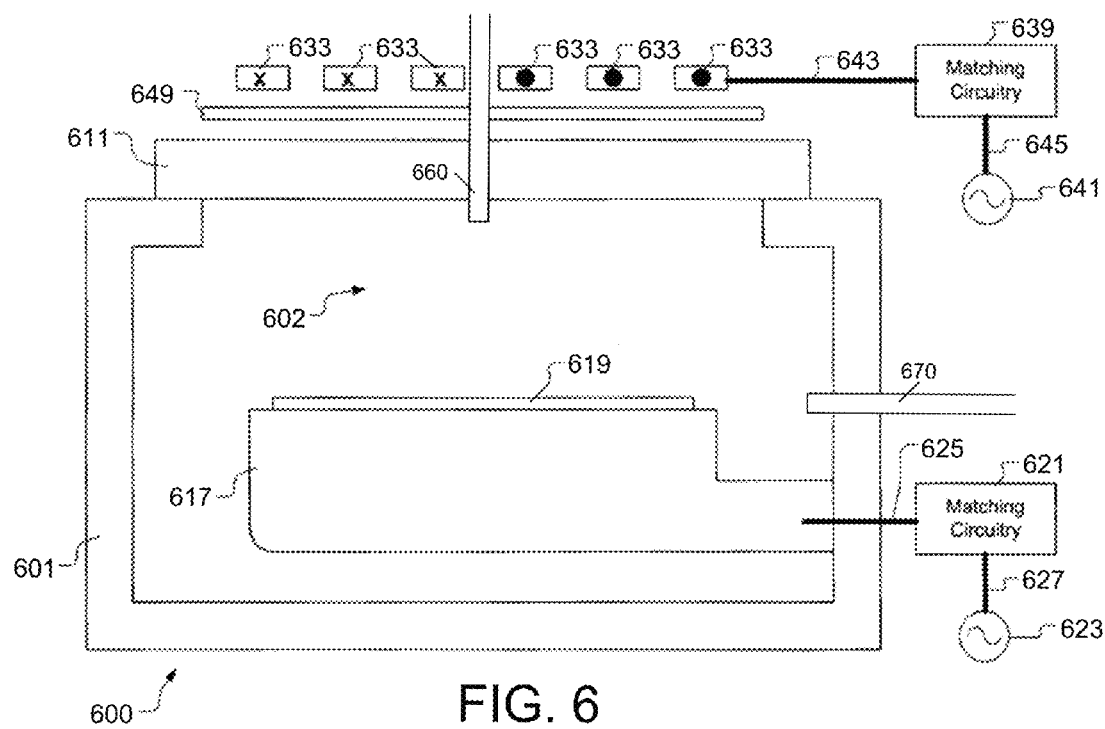
FIG. 6 depicts a cross-sectional view of a reaction chamber for performing the second etching operation in certain embodiments.

FIG. 6 depicts a cross-sectional view of an inductively coupled plasma etching apparatus 600 in accordance with certain embodiments. The inductively coupled plasma etching apparatus 600 includes an etching chamber 602 structurally defined by chamber walls 601 and a window 611. The chamber walls 601 are typically fabricated from stainless steel or aluminum. The window 611 is typically fabricated from quartz or other dielectric material.

A chuck 617 is positioned within the etching chamber 602 near the bottom inner surface of the etching chamber 602. The chuck 617 is configured to receive and hold a semiconductor wafer (i.e., "wafer") 619 upon which the etching process is performed. The chuck 617 can be an electrostatic chuck for supporting the wafer when present. In some embodiments, an edge ring (not shown) surrounds chuck 617, and has an upper surface that is approximately planar with a top surface of a wafer, when present over chuck 617. The chuck 617 also includes electrostatic electrodes to enable the chucking and dechucking of the wafer. A filter and a DC clamp power supply may be provided for this purpose. Other control systems for lifting the wafer off of the chuck 617 can also be provided. The chuck 617 can be electrically charged using an RF power supply 623. The RF power supply 623 is connected to matching circuitry 621 through a connection 627. The matching circuitry 621 is connected to the chuck 617 through a connection 625. In this manner, the RF power supply 623 is connected to the chuck 617.

A coil 633 is positioned above the window 611. The coil 633 is fabricated from an electrically conductive material and includes at least one complete turn. The exemplary coil 633 shown in FIG. 6 includes three turns. The cross-sections of coil 633 symbols having an "X" indicate that the coil 633 extends rotationally into the page. Conversely, the coil 633 symbols having a "•" indicate that the coil 633 extends rotationally out of the page. In various embodiments, the reaction chamber is configured to produce a transformer coupled capacitively tuned plasma. In such embodiments, a transformer coupled capacitive tuning (TCCT) parameter may be controlled to specify the portion of power applied to a center segment of the coil vs. the portion of power applied to an outer segment of the coil.

An RF power supply 641 is configured to supply RF power to the coil 633. In general, the RF power supply 641 is connected to matching circuitry 639 through a connection 645. The matching circuitry 639 is connected to the coil 633 through a connection 643. In this manner, the RF power supply 641 is connected to the coil 633. An optional Faraday shield 649 is positioned between the coil 633 and the window 611. The Faraday shield 649 is maintained in a spaced apart relationship relative to the coil 633. The Faraday shield 649 is disposed immediately above the window 611. The coil 633, the Faraday shield 649, and the window 611 are each configured to be substantially parallel to one another. The Faraday shield may prevent metal or other species from depositing on the dielectric window of the plasma chamber.

Process gases may be supplied through a main injection port 660 positioned in the upper chamber and/or through a side injection port 670, sometimes referred to as an STG. Gas exhaust ports are not shown. Also not shown are pumps connected to the chamber 601 to enable vacuum control and removal of gaseous byproducts from the chamber during operational plasma processing.

During operation of the apparatus, one or more reactant gases may be supplied through the injection ports 660 and/or 670. In certain embodiments, gas may be supplied only through the main injection port, or only through the side injection port. In some cases, the injection ports may be replaced by showerheads. The Faraday shield 649 (and/or an optional grid, described briefly below) may include internal channels and holes that allow delivery of process gas to the chamber. In other words, either or both of Faraday shield 649 and the optional grid may serve as a showerhead for delivery of process gas.

Radiofrequency power is applied from the RF power supply 641 to the coil 633 to cause an RF current to flow through the coil 633. The RF current flowing through the coil 633 generates an electromagnetic field about the coil 633. The electromagnetic field generates an inductive current within the etching chamber 602. The inductive current acts on the gas present in the etching chamber 602 to generate plasma (e.g., a typical electron-ion plasma) in the etching chamber 602.

In certain embodiments, an internal plasma grid (not shown) divides the overall etching chamber 602 into an upper sub-chamber and a lower sub-chamber. The grid may include holes, slots, or other apertures. In certain implementations, a more complex plasma grid assembly is used. For example, the plasma grid assembly may include multiple grids, as well as support structures and movement causing elements. Reaction chambers equipped with inductively coupled plasma generators and grids are further discussed in U.S. patent application Ser. No. 14/184,491, filed Feb. 19, 2014, and titled "INTERNAL PLASMA GRID APPLICATIONS FOR SEMICONDUCTOR FABRICATION," which is herein incorporated by reference in its entirety. The internal plasma grid, where present, limits the amount of hot electrons in the lower sub-chamber. In various embodiments, the apparatus is designed and operated such that the plasma present in the lower sub-chamber is an ion-ion plasma, as discussed in the Ser. No. 14/184,491 application incorporated by reference above.

Both the upper electron-ion plasma and the lower ion-ion plasma will contain positive ions and negative ions, though the ion-ion plasma will have a greater ratio of negative ions: positive ions. The physical and chemical interactions of the various ions and radicals with the wafer 619 selectively etch features of the wafer. Volatile etching byproducts are removed from the lower sub-chamber through an exhaust port (not shown). Importantly, these volatile byproducts are not substantially exposed to hot electrons, and therefore they are not likely to be dissociated into non-volatile "sticky" dissociation products. Where the internal plasma grid is omitted, the plasma is typically generated in the processing chamber above the substrate, and the plasma produced is a typical electron-ion plasma.

Typically, the chuck disclosed herein operates at elevated temperatures ranging between about 30° Celsius and about 250° Celsius, preferably between about 30-650° Celsius. The temperature will depend on the etching process operation and specific recipe. The chamber 601 will also operate at pressures in the range of between about 1 mTorr and about 95 mTorr, or between about 5-20 mTorr.

Although not shown, chamber 601 is typically coupled to facilities when installed in a clean room, or a fabrication facility. Facilities include plumbing that provide processing gases, vacuum, temperature control, and environmental particle control. These facilities are coupled to chamber 601, when installed in the target fabrication facility. Additionally, chamber 601 may be coupled to a transfer chamber that will enable robotics to transfer semiconductor wafers into and out of chamber 601 using typical automation.

Cluster Tool

Figure 7:
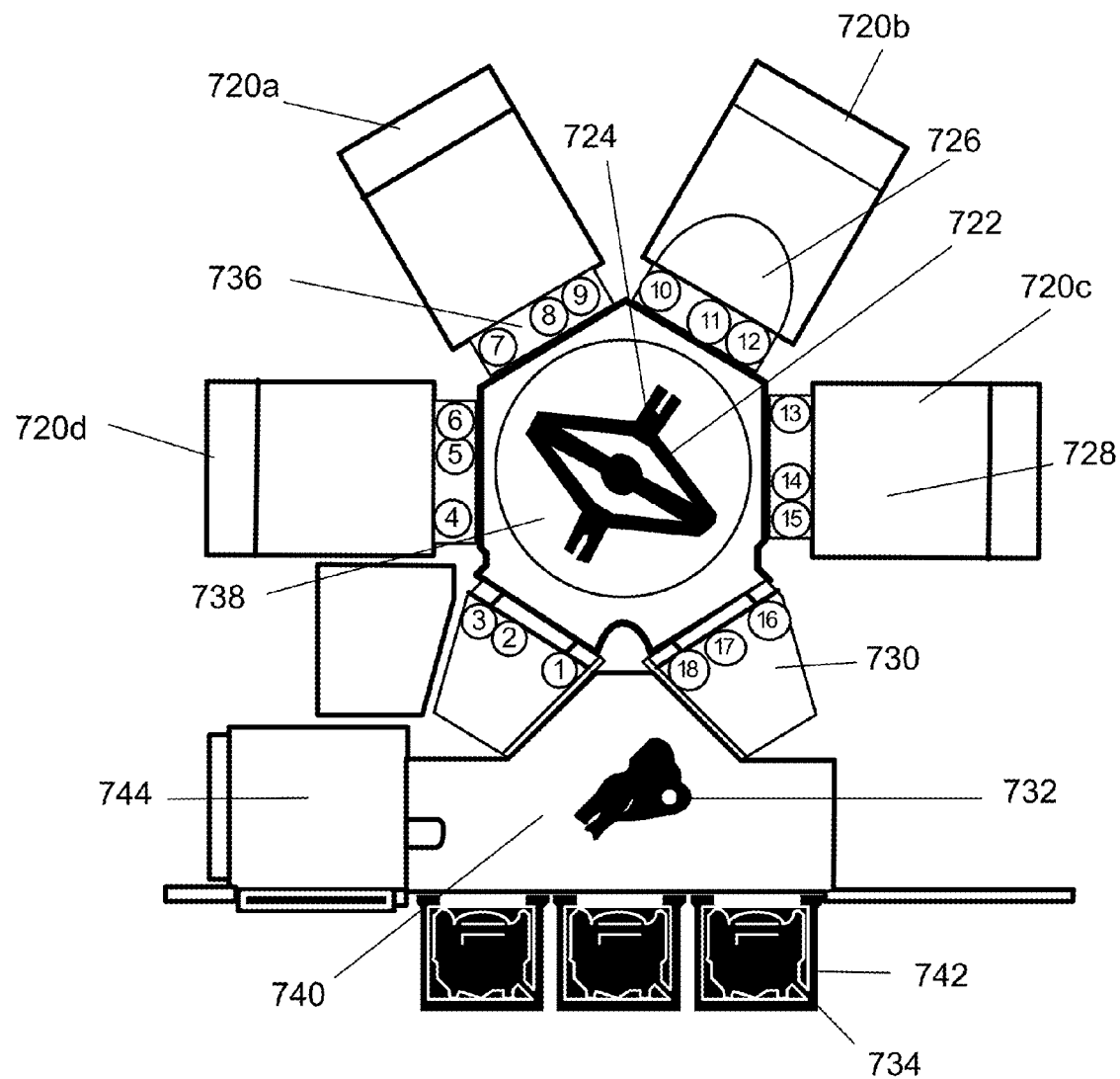
FIG. 7 illustrates a cluster tool for performing various methods herein.

FIG. 7 depicts a semiconductor process cluster architecture with various modules that interface with a vacuum transfer module 738 (VTM). The arrangement of transfer modules to "transfer" substrates among multiple storage facilities and processing modules may be referred to as a "cluster tool architecture" system. Airlock 730, also known as a loadlock or transfer module, is shown in VTM 738 with four processing modules 720a-720d, which may be individual optimized to perform various fabrication processes. By way of example, processing modules 720a-720d may be implemented to perform substrate etching, deposition, ion implantation, substrate cleaning, sputtering, and/or other semiconductor processes as well as laser metrology and other defect detection and defect identification methods. One or more of the processing modules (any of 720a-720d) may be implemented as disclosed herein, i.e., for etching recessed features into substrates using capacitively coupled plasma in a first module and an inductively coupled plasma (transformer coupled capacitively tuned plasma) in a second module. Airlock 730 and process modules 720a-720d may be referred to as "stations." Each station has a facet 736 that interfaces the station to VTM 738. Inside the facets, sensors 1-18 are used to detect the passing of substrate 726 when moved between respective stations.

Robot 722 transfers substrates between stations. In one implementation, the robot may have one arm, and in another implementation, the robot may have two arms, where each arm has an end effector 724 to pick substrates for transport. Front-end robot 732, in atmospheric transfer module (ATM) 740, may be used to transfer substrates from cassette or Front Opening Unified Pod (FOUP) 734 in Load Port Module (LPM) 742 to airlock 730. Module center 728 inside process modules 720a-720d may be one location for placing the substrate. Aligner 744 in ATM 740 may be used to align substrates.

In an exemplary processing method, a substrate is placed in one of the FOUPs 734 in the LPM 742. Front-end robot 732 transfers the substrate from the FOUP 734 to the aligner 744, which allows the substrate 726 to be properly centered before it is etched, or deposited upon, or otherwise processed. After being aligned, the substrate is moved by the front-end robot 732 into an airlock 730. Because airlock modules have the ability to match the environment between an ATM and a VTM, the substrate is able to move between the two pressure environments without being damaged. From the airlock module 730, the substrate is moved by robot 722 through VTM 738 and into one of the process modules 720a-720d, for example process module 720a. In order to achieve this substrate movement, the robot 722 uses end effectors 724 on each of its arms. In process module 720a, the substrate undergoes the first etching operation as described herein using a capacitively coupled plasma to form a partially etched feature. Next, the robot 722 moves the substrate out of processing module 720a, into the VTM 738, and then into a different processing module 720b. In processing module 720b, the partially etched features are etched to their final depths using the second etching operation with an inductively coupled plasma.

It should be noted that the computer controlling the substrate movement can be local to the cluster architecture, or can be located external to the cluster architecture in the manufacturing floor, or in a remote location and connected to the cluster architecture via a network.

System Controller

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

What is claimed is:

1. A method of etching a recessed feature in a semiconductor substrate, the method comprising:
   providing a substrate comprising dielectric material over semiconductor material to a first reaction chamber, wherein the recessed feature is to be formed in the dielectric material;
   performing a first etching operation in the first reaction chamber to etch the recessed feature in the dielectric material to a first depth, the first etching operation comprising exposing the substrate to a first plasma comprising a first set of ions with a mean free path in the dielectric material, the first plasma being a capacitively coupled plasma, wherein after the first etching operation, remaining dielectric material below the first etch depth and above the semiconductor material has a thickness that is at least about the mean free path of the first set of ions in the dielectric material;
   transferring the substrate from the first reaction chamber to a second reaction chamber;
   after transferring the substrate, performing a second etching operation in the second reaction chamber to etch the recessed feature to a final depth, wherein the second etching operation is an atomic layer etching operation that comprises exposing the substrate to a second plasma, the second plasma being an inductively coupled plasma.

2. The method of claim 1, wherein the second etching operation comprises:
   exposing the substrate to an etching reactant and allowing the etching reactant to adsorb onto the substrate surface, removing non-adsorbed etching reactant from the second reaction chamber, after removing the non-adsorbed etching reactant from the second reaction chamber, exposing the substrate to the second plasma to drive a reaction between a species in the adsorbed reactant and dielectric material in the recessed feature to thereby remove a portion of the dielectric material, and repeating the steps of exposing the substrate to an etching reactant, removing the non-adsorbed etching reactant, and exposing the substrate to the second plasma until the recessed feature reaches the final depth.

3. The method of claim 2, wherein the etching reactant comprises a halogen-containing species.

4. The method of claim 1, wherein when the recessed feature reaches the final etch depth, the semiconductor material is exposed.

5. The method of claim 1, wherein the first etching operation comprises:

exposing the substrate to a fluorocarbon plasma to deposit a layer of fluorocarbon polymer on the substrate, and exposing the substrate to the first plasma to etch the fluorocarbon polymer and dielectric.

6. The method of claim 5, wherein exposing the substrate to the first plasma comprises performing a fluorocarbon polymer sputtering stage and performing an activated etch stage.

7. The method of claim 6, wherein exposing the substrate to the first plasma further comprises performing a pure sputtering stage after the fluorocarbon polymer is substantially removed in the activated etch stage.

8. The method of claim 6, wherein during the fluorocarbon polymer sputtering stage and the activated etch stage, a total RF power used to generate the first plasma is about 900 W or less, a pressure in the first reaction chamber is between about 10-40 mTorr, and the substrate is maintained between about 60-110° C., wherein during the fluorocarbon polymer sputtering stage the first plasma is generated from inert gas flowed at a rate between about 20-2000 sccm, and wherein during the activated etch stage, the first plasma is generated from inert gas flowed at a rate between about 40-1000 sccm.

9. The method of claim 5, wherein gas used to generate the fluorocarbon plasma comprises fluorocarbon and inert gas, and wherein gas used to generate the first plasma comprises inert gas.

10. The method of claim 9, wherein the gas used to generate the first plasma substantially does not include non-inert species.

11. The method of claim 1, wherein the mean free path of the first set of ions in the dielectric material is between about 1-10 nm.

12. The method of claim 1, wherein the dielectric material is a silicon oxide, and wherein the recessed feature is a contact hole into which a contact is later formed.

13. The method of claim 1, wherein the recessed feature is a contact hole for a FinFET.

14. The method of claim 13, wherein at the final depth, the etched feature has a width between about 7-30 nm.

15. The method of claim 13, wherein at the final depth, the etched feature has a depth between about 40-150 nm.

16. The method of claim 13, wherein at the final depth, the etched feature has a height:width aspect ratio between about 4:1 and 12:1.

17. The method of claim 1, wherein the first set of ions has a maximum penetration depth in the dielectric material, and wherein after the first etching operation, the thickness of the remaining dielectric material below the first etch depth and above the semiconductor material is at least about the maximum penetration depth of the first set of ions in the dielectric material.

18. An apparatus for etching a recessed feature in dielectric material on a semiconductor substrate, the apparatus comprising:

a first reaction chamber comprising a first plasma generator for generating a capacitively coupled plasma;

a second reaction chamber comprising a second plasma generator for generating an inductively coupled plasma, wherein the first and second reaction chambers are provided together in a cluster tool; and one or more controllers for controlling processes within the first and second reaction chambers, the one or more controllers comprising instructions for:

performing a first etching operation in the first reaction chamber to etch the recessed feature in the dielectric material to a first depth, the first etching operation comprising:

exposing the substrate to a first plasma comprising a first set of ions with a mean free path in the dielectric material, the first plasma being a capacitively coupled plasma, and ceasing the first etching operation before the dielectric material remaining below the first etch depth and above the semiconductor material reaches a thickness that would be less than the mean free path of the first set of ions in the dielectric material;

transferring the substrate from the first reaction chamber to the second reaction chamber; and performing a second etching operation in the second reaction chamber to etch the recessed feature in the dielectric material to a final depth, the second etching operation being an atomic layer etching process comprising:

exposing the substrate to a second plasma, the second plasma being an inductively coupled plasma.

19. The apparatus of claim 18, wherein the instructions for performing the second etching operation further comprise instructions for:

exposing the substrate to an etching reactant and allowing the etching reactant to adsorb onto the substrate surface, removing non-adsorbed etching reactant from the second reaction chamber, after removing non-adsorbed etching reactant from the second reaction chamber, exposing the substrate to the second plasma to drive a reaction between a species in the adsorbed reactant and dielectric material in the recessed feature to thereby remove a portion of the dielectric material, and repeating the steps of exposing the substrate to an etching reactant, removing the non-adsorbed etching reactant, and exposing the substrate to the second plasma until the recessed feature reaches the final depth.

20. The apparatus of claim 18, wherein the instructions for performing the first etching operation comprises instructions for:

exposing the substrate to a fluorocarbon plasma to deposit a layer of fluorocarbon polymer on the substrate, and exposing the substrate to the first plasma to etch the fluorocarbon polymer and dielectric.

21. The apparatus of claim 18, wherein instructions for exposing the substrate to the first plasma comprise instructions for performing a fluorocarbon polymer sputtering stage and an activated etch stage.

22. The apparatus of claim 21, wherein instructions for exposing the substrate to the first plasma further comprise instructions for performing a pure sputtering stage after the fluorocarbon polymer is substantially removed in the activated etch stage.

23. The apparatus of claim 21, wherein the instructions for performing the fluorocarbon polymer sputtering stage comprise instructions to:

flow inert gas at a rate between about 20-2000 sccm to generate the first plasma, supply a total RF power of about 900 W or less to generate the first plasma, maintain a pressure between about 10-40 mTorr in the first reaction chamber, and maintain the substrate at a temperature between about 60-110° C., and wherein the instructions for performing the activated etch stage comprise instructions to:

flow inert gas at a rate between about 40-1000 sccm to generate the first plasma, supply a total RF power of about 900 W or less to generate the first plasma, maintain a pressure between about 10-40 mTorr in the first reaction chamber, and maintain the substrate at a temperature between about 60-110° C.

24. The apparatus of claim 18, wherein the instructions for performing the first etching operation comprise instructions to stop the first etching operation when the first etch depth is between about 40-150 nm.

25. The method of claim 1, wherein a critical dimension of the feature is preserved during the second etching operation.

26. The method of claim 25, wherein the halogen-containing species is selected from the group consisting of: $XeF_2$, $BrF_3$, $IF_5$, and $ClF_3$.

* * * * *